(12) United States Patent
Sugaya et al.

(10) Patent No.: US 7,132,756 B2
(45) Date of Patent: Nov. 7, 2006

(54) SEMICONDUCTOR DEVICE AND METHOD FOR MANUFACTURING THE SAME

(75) Inventors: Yasuhiro Sugaya, Toyonaka (JP); Toshiyuki Asahi, Osaka (JP); Shingo Komatsu, Kadoma (JP); Yoshiyuki Yamamoto, Neyagawa (JP); Seiichi Nakatani, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 110 days.

(21) Appl. No.: 10/692,938

(22) Filed: Oct. 24, 2003

(65) Prior Publication Data

US 2004/0084769 A1    May 6, 2004

(30) Foreign Application Priority Data

Oct. 30, 2002    (JP) .............................. 2002-316614

(51) Int. Cl.
*H01L 23/48* (2006.01)
(52) U.S. Cl. ..................................... 257/787
(58) Field of Classification Search ................ 257/737, 257/738, 735, 783, 787, 713, 734
See application file for complete search history.

(56) References Cited

U.S. PATENT DOCUMENTS

| | | | |
|---|---|---|---|
| 5,926,694 A | 7/1999 | Chigawa et al. | |
| 6,208,525 B1 | 3/2001 | Imasu et al. | |
| 6,335,571 B1 | 1/2002 | Capote et al. | |
| 6,590,287 B1 * | 7/2003 | Ohuchi | 257/738 |
| 6,930,388 B1 * | 8/2005 | Yamaguchi et al. | 257/737 |
| 2002/0056906 A1 | 5/2002 | Kajiwara et al. | |
| 2002/0090759 A1 | 7/2002 | Hashimoto | |

FOREIGN PATENT DOCUMENTS

| | | |
|---|---|---|
| EP | 0 853 337 | 7/1998 |
| EP | 0 907 205 | 4/1999 |
| JP | 9-1881119 | 7/1997 |
| JP | 10-79362 | 3/1998 |
| JP | 11-168112 | 6/1999 |
| JP | 2000-114314 | 4/2000 |
| JP | 2000-150549 | 5/2000 |
| JP | 2001-127108 | 5/2001 |
| JP | 2002-151551 | 5/2002 |

* cited by examiner

*Primary Examiner*—Howard Weiss
*Assistant Examiner*—(Vikki) Hoa B. Trinh
(74) *Attorney, Agent, or Firm*—Hamre, Schumann, Mueller & Larson, P.C.

(57) ABSTRACT

A semiconductor device (1) of the present invention includes a semiconductor element (103) including electrode parts (104), and a wiring substrate (108) including an insulation layer (101), electrode-part-connection electrodes (102) provided in the insulation layer (101), and external electrodes (107) that is provided in the insulation layer (101) and that is connected electrically with the electrode-part-connection electrodes (102), in which the electrode parts (104) and the electrode-part-connection electrodes (102) are connected electrically with each other. The insulation layer (101) has an elastic modulus measured according to JIS K6911 of not less than 0.1 GPa and not more than 5 GPa, and the electrodes (104) and the electrode-part-connection electrodes (102) are connected by metal joint.

12 Claims, 22 Drawing Sheets

SEMICONDUCTOR DEVICE AND METHOD FOR MANUFACTURING THE SAME

BACKGROUND OF THE INVENTION

1. Field of the Invention

The present invention relates to semiconductor devices for use in various kinds of electric apparatuses and electronic apparatuses and a method for manufacturing the same.

2. Description of the Related Art

In recent years, the functions of semiconductor elements have been enhanced, and the size and the number of electrodes of each semiconductor element have been increased remarkably. On the other hand, with the demands for downsizing of electronic apparatuses, the request for downsizing semiconductor devices including semiconductor elements has been raised. Therefore, the type of packages of semiconductor devices has been changed from the quad flat package (QFP) type configured so that external electrodes are arranged in a periphery of a package, to the ball grid array (BGA) type configured so that external electrodes are arranged in an area array style on a lower face of a package, and the chip scale package (CSP) type.

FIG. 19 illustrates an example of a semiconductor device of the CSP type. As shown in FIG. 19, a semiconductor element 1000 including electrode parts (not shown), and a wiring substrate 1003 including electrodes 1002 for connection with the electrode parts (hereinafter referred to as electrode-part-connection electrodes) are connected electrically via bumps 1001, and the area in which they are connected (hereinafter referred to as connection portion) is encapsulated with a resin forming a resin layer 1004. The resin layer 1004 homogeneously disperses stresses occurring due to a difference between the thermal expansion of the semiconductor element 1000 and that of the wiring substrate 1003, thereby preventing the connection portion between the electrode parts and the electrode-part-connection electrodes 1002 from being damaged. External electrodes 1005 are provided on a face of the wiring substrate 1003 opposite to the semiconductor element side face thereof.

A semiconductor device in which electrode parts of a semiconductor element and electrode-part-connection electrodes of a wiring substrate are connected by metal joint via bumps has been disclosed already (see, for instance, in JP 9(1997)-181119 A, and JP 2002-151551 A).

Further, in recent years, a so-called wafer level packaging technology, whereby a plurality of semiconductor elements are packaged together at a wafer level, has been proposed. FIG. 20 shows an example of a semiconductor device manufactured by the wafer level packaging technology. As shown in FIG. 20, a semiconductor element 2000 includes an electronic circuit and electrode pads that are formed on a semiconductor substrate, and bumps 2001 are formed on the electrode pads. The bumps 2001, except for ends thereof, are encapsulated with a resin layer 2002, and the ends of the bumps 2001 function as external electrodes. The resin layer 2002 functions in the same manner as the resin layer 1004 of the semiconductor device shown in FIG. 19 does (see, for instance, JP 10(1998)-79362 A).

However, the conventional semiconductor devices shown in FIGS. 19 and 20 have the following problems. The reduction of stresses by the resin layer 1004 or 2002 cannot be regarded as sufficient, and when reliability such as resistance against thermal shock is evaluated, for instance, the resin layers 1004 and 2002 are prone to the cracking. Further, since the bumps 1001 or 2001 are formed and the connection portion between the semiconductor element and the wiring substrate is encapsulated with the resin layer 1004 or 2002, the manufacturing cost and the number of steps in the manufacturing process increase. Still further, the semiconductor devices shown in FIGS. 19 and 20 both include bumps 1001 and 2001, respectively, and such a configuration hinders the reduction of the thickness of the semiconductor device.

SUMMARY OF THE INVENTION

A semiconductor device of the present invention includes a semiconductor element including an electrode part, and a wiring substrate including an insulation layer, an electrode-part-connection electrode provided in the insulation layer, and an external electrode that is provided in the insulation layer and that is connected electrically with the electrode-part-connection electrode. The electrode part and the electrode-part-connection electrode are connected electrically with each other. In the semiconductor device, the insulation layer has an elastic modulus of not less than 0.1 GPa and not more than 5 GPa, and the electrode and the electrode-part-connection electrode are connected by metal bonding.

A method of the present invention for manufacturing a semiconductor device includes the step of superposing a mounting member and a semiconductor element including an electrode part, the mounting member including an insulation member made of a material containing a resin, an electrode-part-connection electrode provided in the insulation member, and an external electrode provided in the insulation member and connected electrically with the electrode-part-connection electrode, and bonding the electrode part and the electrode-part-connection electrode so that the mounting member and the semiconductor element are integrated. In the method, in the foregoing step, the electrode part is prepared so as to include a metal layer, the electrode-part-connection electrode is prepared so as to include a metal layer, and the metal layer of the electrode part and the metal layer of the electrode-part-connection electrode are connected by metal joint.

Another method of the present invention for manufacturing a semiconductor device includes the steps of (a) superposing a mounting member and a semiconductor element material including a plurality of semiconductor elements having electrode parts, the mounting member including an insulation member made of a material containing a resin, a plurality of sets of electrode-part-connection electrodes provided on a surface of the insulation member on one side thereof, and a plurality of sets of external electrodes provided on a surface of the insulation member on an opposite side thereof, in which the electrode-part-connection electrodes and the external electrodes are connected electrically with each other, and bonding the electrode parts and the electrode-part-connection electrodes, so that the mounting member and the semiconductor element material are integrated, and (b) cutting the semiconductor element material and the mounting member together so that the individual semiconductor elements are separated from one another. The step (b) is carried out after the step (a). In the method, in the step (a), the electrode parts are prepared so as to include metal layers, the electrode-part-connection electrodes are prepared so as to include metal layers, and the metal layers of the electrode parts and the metal layers of the electrode-part-connection electrodes are connected by metal joint.

DESCRIPTION OF THE PREFERRED EMBODIMENTS

Figure 1:
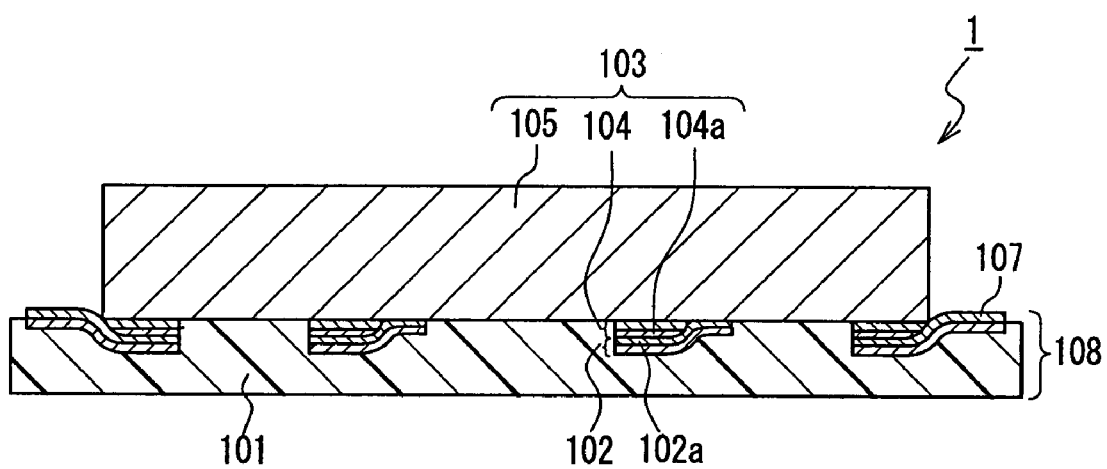
FIG. 1 is a cross-sectional view illustrating an example of a semiconductor device of the present invention.

A semiconductor device of an embodiment of the present invention includes a semiconductor element including an electrode part, and a wiring substrate including an insulation layer, an electrode-part-connection electrode provided in the insulation layer, and an external electrode that is provided in the insulation layer and that is connected electrically with the electrode-part-connection electrode, and the electrode part and the electrode-part-connection electrode are connected electrically with each other. In the semiconductor device, the insulation layer has an elastic modulus of not less than 0.1 GPa and not more than 5 GPa, and the electrode and the electrode-part-connection electrode are connected by metal joint.

With the semiconductor device of the present embodiment, even if the electrode part and the electrode-part-connection electrode are connected directly by metal joint, not via bumps, the wiring substrate including the insulation layer with an elastic modulus of not less than 0.1 GPa and not more than 5 GPa enables the reduction of stresses occurring due to the thermal expansion difference between the semiconductor element and the wiring substrate. Therefore, connection reliability between the electrode part and the electrode-part-connection electrode can be maintained. Further, since the semiconductor device has a structure such that the electrode part and the electrode-part-connection electrode are bonded directly without a bump, the reduction of the thickness and the cost of the device can be achieved. Thus, with the present embodiment, a thin, low-cost, and highly reliable semiconductor device can be provided.

It should be noted that the metal joint herein indicates metal-metal solid phase diffusion bonding, or bonding by intermolecular force. As bonding principles, for instance, diffusion by heating (heating method), ultrasonic bonding, room temperature bonding, etc. are available. The bonding principles are described below, with reference to, for instance, a case where the electrode part and the electrode-part-connection electrode include metal layers made of at least one kind of metal selected from the group consisting of noble metals and solder alloys.

(1) Diffusion by Heating

By bringing metal layer of the electrode part and metal layer of the electrode-part-connection electrode into contact with each other and heating the same, metal atoms composing the metal layer of the electrode part and metal atoms of the metal layer of the electrode-part-connection electrode are diffused in to each other, and a bonding structure in which the electrode part and the electrode-part-connection electrode are connected by metal joint is obtained. A contamination layer present at interfaces between the metal layer of the electrode part and the metal layer of the electrode-part-connection electrode is decomposed and removed by the foregoing diffusion. In the case where the kind of metal atoms composing the metal layer of the electrode part and the kind of metal atoms composing the metal layer of the electrode-part-connection electrode are different from each other, an alloy layer is formed by the foregoing diffusion.

(2) Ultrasonic Bonding

By bringing the metal layer of the electrode and the metal layer of the electrode-part-connection electrode into contact with each other and applying ultrasonic wave to them, a contamination layer present at interfaces between the metal layer of the electrode part and the metal layer of the electrode-part-connection electrode is decomposed finely by repetitive sliding and expansion. The decomposed contamination layer is taken into metallic crystals of each metal layer, whereby a bonding structure in which the electrode part and the electrode-part-connection electrode are connected by metal joint is obtained.

(3) Room Temperature Bonding

If the metal layer of the electrode part and the metal layer of the electrode-part-connection electrode are brought into contact with each other in a state in which surfaces of the metal layer of the electrode part and the metal layer of the electrode-part-connection electrode are cleaned (oxide films and contamination layers are removed), a bonding structure in which the metal layer of the electrode part and the metal layer of the electrode-part-connection electrode are bonded by the intermolecular force is obtained.

In the semiconductor device of the present embodiment, it is preferable that the semiconductor element includes a plurality of the electrode parts, and a surface of the wiring substrate on a semiconductor element side and a surface of the semiconductor element on a wiring substrate side are bonded with each other so that spaces between the electrode parts are filled with the insulation layer. With this configuration, stresses occurring due to a thermal expansion difference between the semiconductor element and the wiring substrate can be reduced more effectively, and a thinner semiconductor device can be provided.

In the semiconductor device of the present embodiment, it is preferable that a surface of the wiring substrate crossing a thickness direction of the semiconductor device perpendicularly is larger than a surface of the semiconductor element crossing the thickness direction of the semiconductor device perpendicularly. In the semiconductor device of a wafer level package structure, a region where lines for connecting the electrode-part-connection electrodes with the external electrodes are arranged (rewiring region) is determined according to the size of the semiconductor element. Therefore, it is difficult to manufacture a semiconductor device of the wafer level package structure employing a semiconductor element having, for instance, not less than 100 pins of electrode parts (pad electrodes), since a rewiring region thereof is small relative to the number of electrode parts thereof. Besides, in recent years, a semiconductor element is downsized increasingly as the wiring rules become finer, and the size of a rewiring region thereof is decreased. As in the semiconductor device of the present embodiment, by making a surface of the wiring substrate crossing a thickness direction of the semiconductor device perpendicularly larger than a surface of the semiconductor element crossing the thickness direction of the semiconductor device perpendicularly, the lines can be provided so as to extend from the electrode parts (pad electrodes) of the semiconductor element to the periphery of the semiconductor element. With this configuration, a semiconductor device employing a semiconductor element having a greater number of electrode parts (pad electrodes) can be provided.

In the semiconductor device of the present embodiment, in the case where the surface of the wiring substrate crossing the thickness direction of the semiconductor device perpendicularly is larger than the surface of the semiconductor element crossing the thickness direction of the semiconductor device perpendicularly, the external electrode may be arranged on a surface of the insulation layer that is seen when the semiconductor device is observed in the thickness direction thereof from a semiconductor element side. This configuration allows the electrode-part-connection electrodes and the external electrodes to be formed at the same time, thereby making it possible to provide a further low-cost semiconductor device.

In the semiconductor device of the present embodiment, it is preferable that the wiring substrate further includes an inner via that is provided in the insulation layer so as to go through the insulation layer in a thickness direction thereof, and the electrode-part-connection electrode and the external electrode are connected electrically through the inner via. This configuration allows a semiconductor device to be provided with a high degree of freedom in wiring layout.

In the semiconductor device of the present embodiment, the wiring substrate preferably further includes at least one wiring layer arranged in the insulation layer. This configuration allows a semiconductor device to be provided with a higher degree of freedom in wiring layout.

In the semiconductor device of the present embodiment, preferably, the insulation layer is made of a material containing a thermosetting resin, and the material containing a thermosetting resin contains 75 wt % to 91 wt % of an inorganic filler, and 9 wt % to 25 wt % of a resin composition containing a thermosetting resin. The thermosetting resin preferably contains at least one kind of resin selected from the group consisting of epoxy resins, phenol resins, cyanate resins, and thermosetting polyimide. In the case where the material containing the thermosetting resin does not contain thermosetting polyimide, the material containing the thermosetting resin preferably contains a thermosetting resin with a glass transition temperature of not higher than 150° C. The wiring substrate including the insulation layer made of such a material is capable of reducing stresses occurring due to the thermal expansion difference between the semiconductor element and the wiring substrate, even if the electrode part and the electrode-part-connection electrode are bonded directly by metal joint.

The reason why the material containing a thermosetting resin contains 75 wt % to 91 wt % of an inorganic filler, and 9 wt % to 25 wt % of a resin composition containing a thermosetting resin is as follows. If the inorganic filler is less than 75 wt %, the thermal expansion coefficient of the insulation layer increases, while the thermal conductivity thereof decreases. If the inorganic filler is more than 91 wt %, the decease in the amount of the thermosetting resin makes it difficult to form the sheet-like material that is to become the insulation layer when it is cured, and the sheet-like material thus formed tends to be torn easily.

In the semiconductor device of the present embodiment, the semiconductor element preferably has a thickness of not less than 30 μm and not more than 100 μm. If the semiconductor element has a thickness of not less than 30 μm and not more than 100 μm, the semiconductor element has a mechanical characteristic of flexibility. This semiconductor element, in combination with the wiring substrate including the insulation layer with an elastic modulus of not less than 0.1 GPa and no more than 5 GPa, is capable of reducing stresses that occur due to a thermal expansion difference between the semiconductor element and the wiring substrate, and therefore, enhances the connection reliability of the semiconductor device. It should be noted that the semiconductor element can be processed easily so as to have a desired thickness without damaging the circuit formed on a surface of the semiconductor element as long as the thickness is not less than 30 μm.

In the semiconductor device of the present embodiment, the insulation layer has a thickness of not less than 30 μm and not more than 200 μm. If the thickness thereof is less than 30 μm, the insulation layer is difficult to handle, whereas if it exceeds 200 μm, this hinders the thinning of the semiconductor device.

In the semiconductor device of the present embodiment, the semiconductor device preferably has a thickness of not less than 60 μm and not more than 300 μm. It is difficult to manufacture a semiconductor device with a thickness of less than 60 μm, and an excessively great thickness thereof causes the elastic modulus of the semiconductor device as a whole to increase. Such a thin semiconductor device with a small elastic modulus as described above enables the reduction of stresses occurring due to the thermal expansion difference between the semiconductor device and a substrate on which the semiconductor device is mounted, and allows the connection reliability of a module incorporating the semiconductor device to increase.

A method for manufacturing a semiconductor device according to an embodiment of the present invention includes the step of superposing a mounting member and a semiconductor element including an electrode part, the mounting member including an insulation member made of a material containing a resin, an electrode-part-connection electrode provided in the insulation member, and an external electrode provided in the insulation member and connected electrically with the electrode-part-connection electrode, and bonding the electrode part and the electrode-part-connection electrode so that the mounting member and the semiconductor element are integrated. In the method, in the step, the electrode part is prepared so as to include a metal layer, the electrode-part-connection electrode is prepared so as to include a metal layer, and the metal layer of the electrode part and the metal layer of the electrode-part-connection electrode are connected by metal joint.

By the foregoing method, a thin, low-cost, and highly reliable semiconductor device can be provided.

In the method of the present embodiment for manufacturing a semiconductor device, in the step, the insulation member may be formed with a material containing a thermosetting resin in a non-cured state, and the mounting member and the semiconductor element that are superposed are subjected to heat and pressure so that the thermosetting resin is cured.

In the method of the present embodiment for manufacturing a semiconductor device, the step further preferably includes a sub-step of, after curing the thermosetting resin, heating the metal layer of the electrode part and the metal layer of the electrode-part-connection electrode using ultrasonic vibration. By applying ultrasonic waves after the thermosetting resin is cured, the ultrasonic vibration is transmitted easily to the metal layers of the electrode parts and the metal layers of the electrode-part-connection electrodes, whereby metal joint can be obtained with increased bonding strength.

In the method of the present embodiment for manufacturing a semiconductor device, in the step, the metal layer of the electrode part and the metal layer of the electrode-part-connection electrode preferably are formed with at least one kind of metal selected from the group consisting of noble metals and solder alloys.

In the method of the present embodiment for manufacturing a semiconductor device, the step preferably includes sub-steps of preparing a transfer carrier provided with a wiring pattern, superposing the transfer carrier provided with the wiring pattern and the insulation member so that the wiring pattern and the insulation member are brought into contact with each other, and removing only the transfer carrier from the insulation member, so that the electrode-part-connection electrode is formed on the insulation member.

In the method of the present embodiment for manufacturing a semiconductor device, the step preferably includes sub-steps of filling a conductive material inside the insulation member, providing the electrode-part-connection electrode on a surface of the insulation member on one side thereof, and providing the external electrode on the other surface of the insulation member on an opposite side thereof, so that the mounting member is formed. By this method, a semiconductor device can be provided with a high degree of freedom in wiring layout.

In the method of the present embodiment for manufacturing a semiconductor device, the step further preferably includes sub-steps of preparing a plurality of sheet-like materials that are made of the material containing a thermosetting resin in a non-cured state, that have through holes, and that are to become the insulation member when they are laminated, filling the conductive material in the through holes, and laminating the sheet-like materials in a manner such that a wiring layer is arranged between the different sheet-like materials, so that the insulation member filled with the conductive material is prepared. By this method, a semiconductor device can be provided with a higher degree of freedom in wiring layout.

The method of the present embodiment for manufacturing a semiconductor device preferably further includes a step of processing the semiconductor element so that the semiconductor element has a thickness of not less than 30 µm and not more than 100 µm, the processing step being carried out after the mounting and bonding step. In this method, handling the semiconductor element when thinning the semiconductor element bonded with the wiring substrate is easier than when bonding the previously thinned semiconductor element with the wiring substrate.

In the method of the present embodiment for manufacturing a semiconductor device, the material containing a thermosetting resin in a non-cured state preferably contains 75 wt % to 91 wt % of an inorganic filler, and 9 wt % to 25 wt % of a resin composition containing a thermosetting resin, and the thermosetting resin preferably contains at least one kind of resin selected from the group consisting of epoxy resins, phenol resins, cyanate resins, and thermosetting polyimide. Besides, in the case where the material containing the thermosetting resin in a non-cured state does not contain thermosetting polyimide, the material containing the thermosetting resin in a non-cured state preferably contains a thermosetting resin with a glass transition temperature of not higher than 150° C. It should be noted that the content of the inorganic filler and the content of the resin composition containing a thermosetting resin are calculated in terms of a composition that does not contain a solvent.

Another method of the present embodiment for manufacturing a semiconductor device includes the steps of (a) superposing a mounting member and a semiconductor element material including a plurality of semiconductor elements having electrode parts, the mounting member including an insulation member made of a material containing a resin, a plurality of sets of electrode-part-connection electrodes provided on a surface of the insulation member on one side thereof, and a plurality of sets of external electrodes provided on a surface of the insulation member on an opposite side thereof, wherein the electrode-part-connection electrodes and the external electrodes are connected electrically with each other, and bonding the electrode parts and the electrode-part-connection electrodes, so that the mounting member and the semiconductor element material are integrated, and (b) cutting the semiconductor element material and the mounting member together so that the individual semiconductor elements are separated from one another. The step (b) is carried out after the step (a). In the method, in the step (a), the electrode parts are prepared so as to include metal layers, the electrode-part-connection electrodes are prepared so as to include metal layers, and the metal layers of the electrode parts and the metal layers of the electrode-part-connection electrodes are connected by metal joint.

By the foregoing method, a downsized, thin, low-cost, and highly reliable semiconductor device can be provided.

In the another method of the present embodiment for manufacturing a semiconductor device, in the step (a), the insulation member may be formed with a material containing a thermosetting resin in a non-cured state, and the mounting member and the semiconductor element material that are superposed are subjected to heat and pressure so that the thermosetting resin is cured.

In the another method of the present embodiment for manufacturing a semiconductor device, the step (a) preferably further includes a sub-step of, after curing the thermosetting resin, heating the metal layers of the electrode parts and the metal layers of the electrode-part-connection electrodes using ultrasonic vibration. By applying ultrasonic wave after the thermosetting resin is cured, the ultrasonic vibration is transmitted easily to the metal layers of the electrode parts and the metal layers of the electrode-part-connection electrodes, whereby metal joint can be obtained with increased bonding strength.

The method of the present embodiment for manufacturing a semiconductor device preferably further includes a step of processing the semiconductor elements so that the semiconductor elements have a thickness of not less than 30 µm and not more than 100 µm each, the step being carried out after the step (a) and prior to the step (b). Since the semiconductor elements are processed so as to have a desired thickness before the semiconductor element material is cut into the individual semiconductor elements, this provides high productivity, and facilitates the stress relief step for removing the portions of the semiconductor elements in which stresses remain.

In the method of the present embodiment for manufacturing a semiconductor device, in the step (a), the metal layers of the electrode parts and the metal layers of the electrode-part-connection electrodes preferably are formed with at least one kind of metal selected from the group consisting of noble metals and solder alloys.

In the method of the present embodiment for manufacturing a semiconductor device, the step (a) preferably includes sub-steps of preparing a transfer carrier provided with a wiring pattern, superposing the transfer carrier provided with the wiring pattern and the insulation member so that the wiring pattern and the insulation member are brought into contact with each other, and removing only the transfer carrier from the insulation member, so that the electrode-part-connection electrodes are formed on the insulation member.

In the method of the present embodiment for manufacturing a semiconductor device, the step (a) preferably further includes sub-steps of preparing a plurality of sheet-like materials that are made of the material containing a thermosetting resin in a non-cured state, that have through holes, and that are to become the insulation member when they are laminated, filling a conductive material in the through holes, and laminating the sheet-like materials in a manner such that a wiring layer is arranged between the different sheet-like materials, so that the insulation member filled with the conductive material is prepared. This provides a semiconductor device with a high degree of freedom in wiring layout.

In the method of the present embodiment for manufacturing a semiconductor device, the material containing a thermosetting resin in a non-cured state preferably contains 75 wt % to 91 wt % of an inorganic filler, and 9 wt % to 25 wt % of a resin composition containing a thermosetting resin, and the thermosetting resin preferably contains at least one kind of resin selected from the group consisting of epoxy resins, phenol resins, cyanate resins, and thermosetting polyimide. Besides, in the case where the material containing the thermosetting resin in a non-cured state does not contain thermosetting polyimide, the material containing the thermosetting resin in a non-cured state preferably contains a thermosetting resin with a glass transition temperature of not higher than 150° C. It should be noted that the content of the inorganic filler and the content of the resin composition containing a thermosetting resin are calculated in terms of a composition that does not contain a solvent.

The following will describe preferred embodiments of the present invention, while referring to the drawings.

Embodiment 1

The following will describe a semiconductor device according to the present embodiment, while referring to FIG. 1. As shown in FIG. 1, a semiconductor device 1 of the present embodiment includes a semiconductor element 103 that includes electrode parts 104, and a wiring substrate 108. The wiring substrate 108 includes an insulation layer 101 having an elastic modulus of not less than 0.1 GPa and not more than 5 GPa, electrodes 102 for connection with the electrode parts (hereinafter referred to as electrode-part-connection electrodes) provided in the insulation layer 101, and external electrodes 107 that are provided in the insulation layer 101 and that are connected electrically with the electrode-part-connection electrodes 102. The semiconductor element 103 includes a body part 105 (a part including the semiconductor chip) and the electrode parts 104, and the electrode parts 104 protrude out of the body part 105 on the wiring substrate 108 side.

Each electrode part 104 includes a metal layer 104a, and each electrode-part-connection electrode 102 includes a metal layer 102a. In the semiconductor device 1, the metal layers 104a of the electrode parts 104 and the metal layers 102a of the electrode-part-connection electrodes 102 are connected by metal joint.

In the semiconductor device 1, a surface of the wiring substrate 108 perpendicularly crossing a thickness direction of the semiconductor device 1 is larger than a surface of the semiconductor element 103 perpendicularly crossing the thickness direction of the semiconductor device 1. In other words, the surface of the wiring substrate 108 on the semiconductor element side is larger than the surface of the semiconductor element 103 on the wiring substrate side. The external electrodes 107 are disposed in a portion of a surface of the insulation layer 101 on the semiconductor element side where the semiconductor element 103 is not bonded (in a peripheral portion), namely, so as to surround the semiconductor element 103. In other words, the external electrodes 107 are arranged on the surface of the insulation layer 101 that is seen when the semiconductor device 1 is observed in the thickness direction from the semiconductor element side. As described above, the external electrodes 107 are connected electrically with the electrode-part-connection electrodes 102.

In the semiconductor device 1, even if the electrode parts 104 and the electrode-part-connection electrodes 102 are connected directly by metal joint, not via bumps, the wiring substrate 108 including the insulation layer 101 with an elastic modulus of not less than 0.1 GPa and not more than 5 GPa enables the reduction of stresses occurring due to the thermal expansion difference between the semiconductor element 103 and the wiring substrate 108. Therefore, connection reliability can be maintained. Further, since the semiconductor device has a structure such that the electrode parts 104 and the electrode-part-connection electrodes 102 are bonded directly without bumps, the reduction of the thickness and the cost of the device can be achieved. Thus, with the present embodiment, a thin, low-cost, and highly reliable semiconductor device can be provided.

Metals contained in the metal layers 104a and 102a are not limited particularly, and at least one kind of metal selected from, for instance, noble metals and solder alloys may be contained therein. Examples of the noble metals include Au, Ag, Cu, Ru, Rb, Pd, Os, Ir, Pt, etc. Examples of the solder alloys include Pb—Sn, Pb—Ag, Bi—Sn, Zn—Cd, Pb—Sn—Sb, Pb—Sn—Cd, Pb—Sn—In, Bi—Sn—Sb etc. The metal layers 104a and 102a preferably are made of Au in particular. This is because stable metal joint can be achieved easily at an interface between Au and Au by application of heat and pressure.

In the semiconductor device of the present embodiment, as shown in FIG. 1, the semiconductor element 103 includes a plurality of electrode parts 104, and the surface of the wiring substrate 108 on the semiconductor element side and the surface of the semiconductor element 103 on the wring substrate side preferably are bonded so that spaces between the electrode parts are filled with the insulation layer 101. This is because, by thus bonding the surface of the wiring substrate 108 on the semiconductor element side and the surface of the semiconductor element 103 on the wiring substrate side in a manner such that the electrode parts 104 and the electrode-part-connection electrodes 102 are embedded in a sheet-like material that is to be the insulation layer 101 after it is cured, stresses occurring due to the thermal expansion difference between the semiconductor element 103 and the wiring substrate 108 can be reduced more effectively. Moreover, a thinner semiconductor device can be provided.

The insulation layer 101 is required to have an elastic modulus of not less than 0.1 GPa and not more than 5 GPa. In the case where the elastic modulus exceeds 5 GPa, the stresses occurring due to the thermal expansion difference between the semiconductor element 103 and the wiring substrate 108 cannot be reduced sufficiently by the wiring substrate 108 including the insulation layer 101, which makes it impossible to maintain the connection reliability between the electrode parts 104 and the electrode-part-connection electrode 102. On the other hand, in the case where the elastic modulus is less than 0.1 GPa, the semiconductor device including such an insulation layer 101 is difficult to handle.

A material of the insulation layer 101 is not limited particularly as long as the material has an elastic modulus of not less than 0.1 GPa and not more than 5 GPa. For instance, a material containing a thermosetting resin can be used. As the material containing a thermosetting resin, a mixture of a resin composition containing a thermosetting resin and an inorganic filler, for instance, can be used.

Next, a mixture of an inorganic filler and a resin composition containing a thermosetting resin is described below.

The resin composition preferably contains, as the thermosetting resin, at least one kind of resins selected from the group consisting of epoxy resins, phenol resins, cyanate resins, and thermosetting polyimide. Brominated epoxy resins preferably are used in particular, since they exhibit fire retardance. Further, in the case where the resin composition does not contain thermosetting polyimide, it preferably contains a thermosetting resin having a glass transition temperature (Tg) of not higher than 150° C. In the case where the thermosetting resin contained in the resin composition contains two or more kinds of resins selected from the foregoing group (excluding thermosetting polyimide), at least one kind of a thermosetting resin may have a glass transition temperature (Tg) of not higher than 150° C. It should be noted that in the case where the resin composition contains thermosetting resins that are categorized as the same kind but have different glass transition temperatures (Tg), for instance, two kinds of epoxy resins having different glass transition temperatures (Tg), these resins are regarded as resins of different kinds, and at least one kind of an epoxy resin among the foregoing two or more kinds of epoxy resins may have a glass transition temperature of not higher than 150° C. It should be noted that no lower limit of the glass transition temperature is set particularly, but normally, the glass transition temperature preferably is not lower than 50° C.

In the case where the resin composition contains two or more kinds of resin, a proportion by weight between the thermosetting resin having a glass transition temperature of not higher than 150° C. and the other resins is not limited particularly, but normally the ratio by weight preferably is 1:3 to 3:1.

The foregoing resin composition further may contain a curing agent or a curing accelerator. For instance, a bisphenol-A type Novolac resin and imidazole can be used as the curing agent and the curing accelerator, respectively. The foregoing resin composition may further contain an additive such as a dispersant, a colorant, a coupling agent, a mold releasing agent, etc.

Examples usable as a solvent for decreasing the viscosity of a mixture that contains an inorganic filler and a resin composition containing a thermosetting resin include ethyl carbitol, butyl carbitol, and butyl carbitol acetate. These have boiling points of not lower than 150° C. Additionally, the examples include methyl ethyl ketone, isopropanol, toluene, etc. These have boiling points of not higher than 100° C. One kind, or two or more kinds of these solvents may be used.

It should be noted that the foregoing solvent is unnecessary if it is possible, without mixing the solvent in the mixture of the inorganic filler and the resin composition containing the thermosetting resin, to embed the electrode parts 104 and the electrode-part-connection electrodes 102 in a sheet-like material that is to become the insulation layer 101 when it is cured in the manufacturing process of the semiconductor device of the present embodiment.

As the inorganic filler, at least one kind selected from the group consisting of, for instance, $Al_2O_3$, MgO, $SiO_2$, BN, and AlN can be used. These are preferred since they have high thermal conductivities. The inorganic filler preferably has a particle diameter of not less than 0.1 μm and not more than 100 μm. If the particle diameter is excessively small or large, the filling factor of the inorganic filler in the insulation layer 101 decreases, thereby causing the thermal conductivity of the insulation layer 101 to decrease. Further, it also causes the difference of a coefficient of thermal expansion of the insulation layer 101 from that of the semiconductor element 103.

In the mixture of containing the inorganic filler and the resin composition the thermosetting resin, the content of the inorganic filler preferably is 75 wt % to 91 wt %. If it is less than 75 wt %, the coefficient of thermal expansion of the insulation layer 101 increases, while the thermal conductivity thereof decreases. On the other hand, if it is more than 91 wt %, the decease in the amount of the thermosetting resin makes it difficult to form the sheet-like material that is to become the insulation layer 101 when it is cured, and the sheet-like material thus formed tends to be torn easily. It should be noted that in the case where the content of the inorganic filler is 75 wt % to 91 wt %, the content of the resin composition in the mixture of the inorganic filler and the resin composition containing a thermosetting resin is 9 wt % to 25 wt %. It should be noted that the content of the inorganic filler in the insulation layer and the content of the resin composition containing a thermosetting resin in the insulation layer are determined on the basis of a composition that does not contain a solvent.

In the mixture of the inorganic filler and the resin composition containing the thermosetting resin, the more preferable content of the inorganic filler is 80 wt % to 88 wt %. With this content, the sheet-like material that is to become the insulation layer can be formed easily, and the wiring substrate 108 having a high thermal conductivity can be obtained. In this case, the content of the resin composition containing a thermosetting resin is 12 wt % to 20 wt %.

The mixture of the inorganic filler and the resin composition containing a thermosetting resin preferably does not contain a reinforcer such as glass fiber. This is because, in the case where a reinforcer is not contained, the wiring substrate 108 having a low elastic modulus can be obtained easily. Even without such a reinforcer, it is possible to maintain a mechanical strength of the insulation layer 101, since the inorganic filler is filled at a high density.

The insulation layer 101 preferably has a thickness of not less than 30 μm and no less than 200 μm. If the thickness is less than 30 μm, the insulation layer 101 is difficult to handle, and if the thickness is more than 200 μm, the semiconductor device has an excessive thickness. Further, the thickness more preferably is not less than 50 μm and not more than 150 μm. The thickness in this range is preferred from the viewpoints of handlability, thickness, and elasticity.

The electrode-part-connection electrodes 102 can be made of a material having electrical conductivity, for instance, a copper foil or a conductive resin composition. Examples of a method for forming the electrode-part-connection electrodes 102 include the subtractive method, the additive method, etc. In the present embodiment, the electrode-part-connection electrodes 102 including the metal layers 102a, for instance, Au layers are formed through, for instance, the following process. First, a copper foil is laminated on the sheet-like material that is to become the insulation layer 101, and after the application of pressure thereto, unnecessary portions of the copper foil are removed. Thereafter, the copper foil is subjected to electroless plating.

The external electrodes 107 also can be formed with a material having electrical conductivity, for instance, a copper foil, a conductive resin composition, etc., like the electrode-part-connection electrodes 102, and they can be formed through the same process as that for the electrode-part-connection electrodes 102. In the semiconductor device 1 of the present embodiment, in the manufacturing process, the electrode-part-connection electrodes 102 are formed on one of the surfaces of the sheet-like material that is to become the insulation layer 101, and the external electrodes 107 also are formed on the foregoing surface of the sheet-like material. Therefore, the electrode-part-connection electrodes 102 and the external electrodes 107 can be formed at the same time.

It should be noted that, though in the semiconductor device 1 of the present embodiment the surface of the wiring substrate 108 on the semiconductor element side and the surface of the semiconductor element 103 on the wiring substrate side are bonded with each other so that spaces between the electrode parts 104 are filled with the insulation layer 101, the semiconductor device of the present embodiment is not limited to this configuration. For instance, the surface of the semiconductor element 103 (surface of the body part 105) may be bonded with the insulation layer 101 by embedding the surface of the semiconductor element 103 on the wiring substrate side into the sheet-like material that is to become the insulation layer 101 after it is cured. In other words, the body part 105 of the semiconductor element 103 may be embedded in the insulation layer 101.

Still further, though in the semiconductor device of the present embodiment described with reference to FIG. 1 each of the electrode parts 104 and the electrode-part-connection electrodes 102 has a structure that includes, for instance, a copper foil or a conductive resin composition, and an Au layer formed on its surface by plating, their configuration is not limited to this. As to at least one of the electrode parts 104 and the electrode-part-connection electrodes 102, an entirety of each of the same may be made of, for instance, a noble metal such as Au, a solder alloy, or the like.

Embodiment 2

Figure 2A:
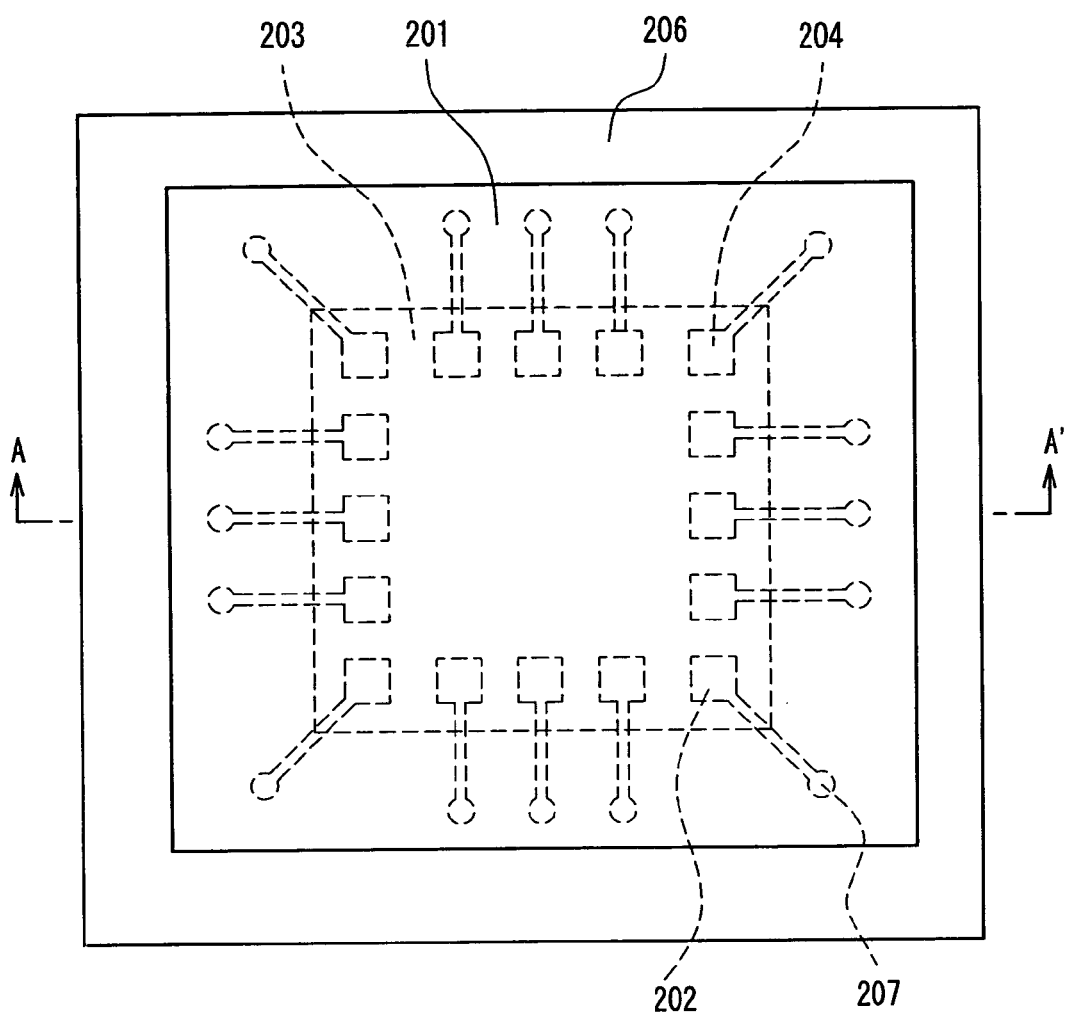
FIG. 2A is a plan view illustrating another example of a semiconductor device of the present invention.
Figure 2B:
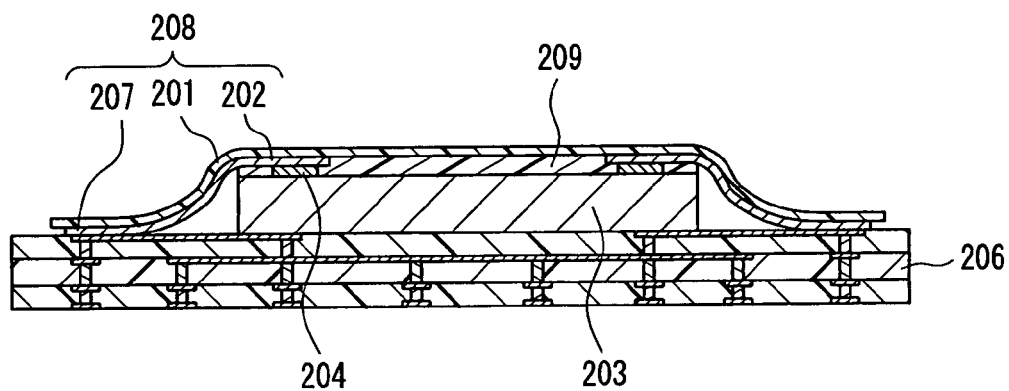
FIG. 2B is a cross-sectional view of the semiconductor device shown in FIG. 2A, taken along a line A–A'.
Figure 3A:
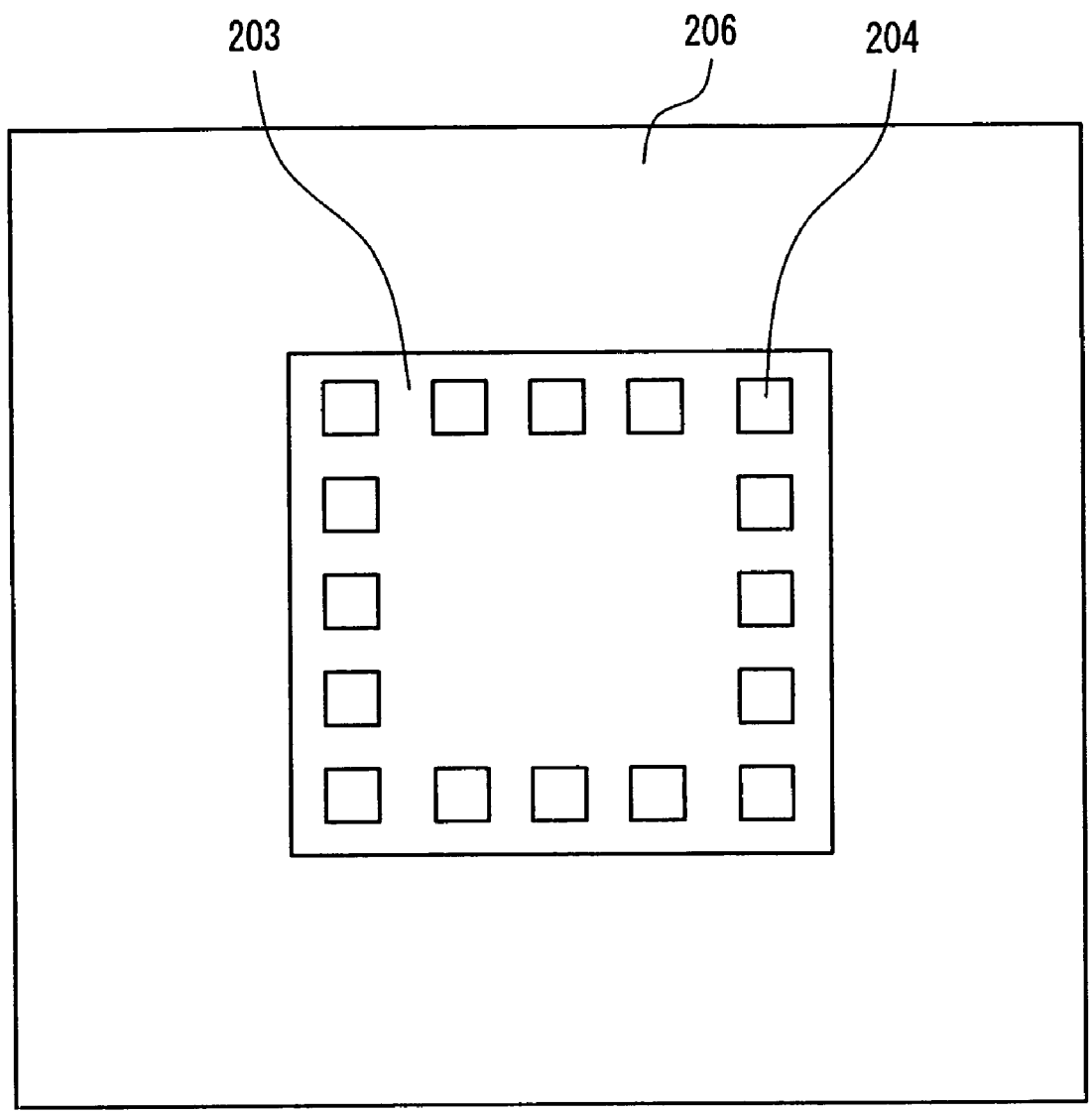
FIGS. 3A and 3B are views illustrating an example of a process for manufacturing the semiconductor device shown in FIG. 2A.
Figure 3B:
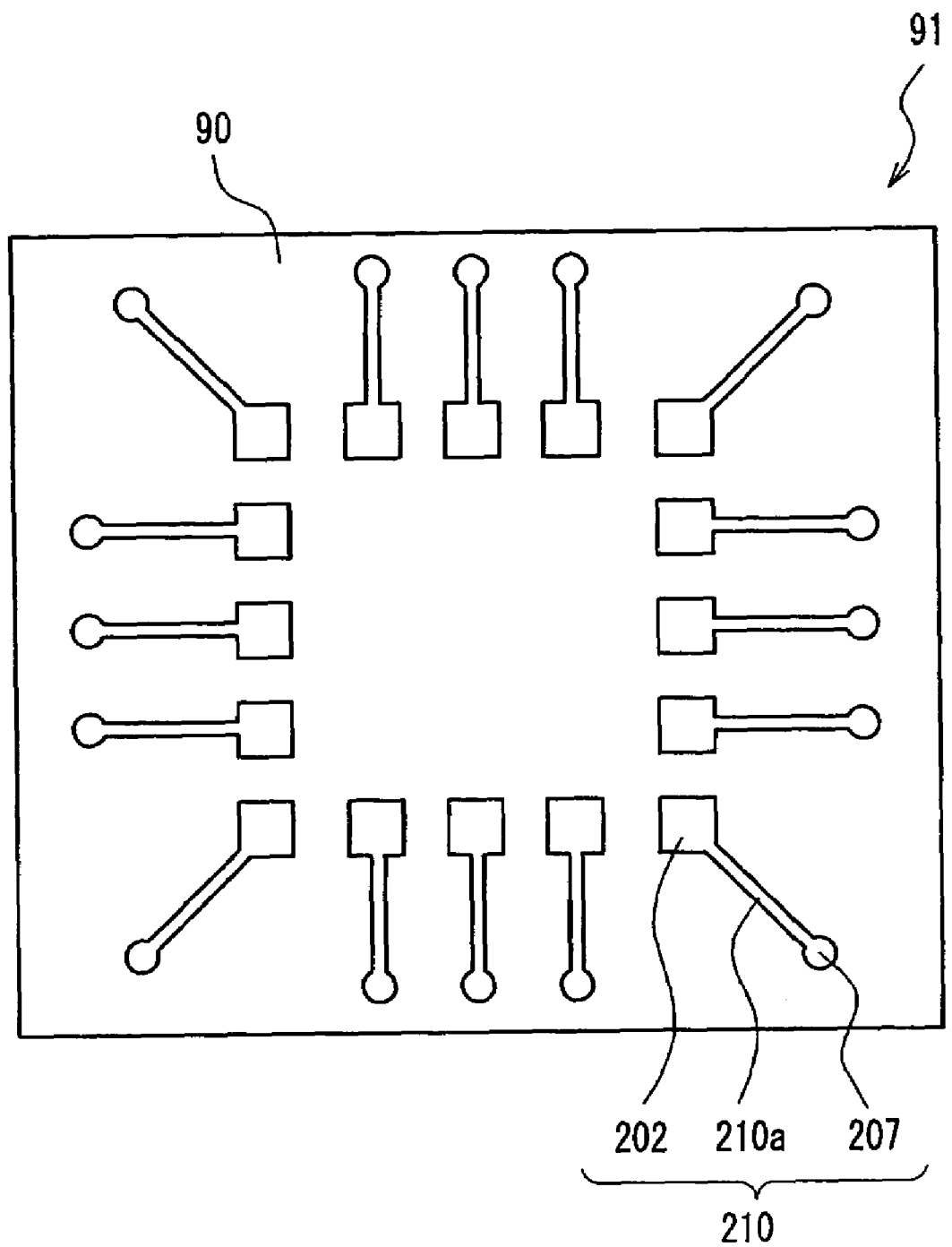

The following will describe a semiconductor device according to an embodiment of the present invention, while referring to FIGS. 2A to 3B. FIG. 2A is a plan view illustrating a state in which a semiconductor device of the present embodiment is mounted on a motherboard 206, and FIG. 2B is a cross-sectional view of the same. FIGS. 3A and 3B are views illustrating steps of an example of a manufacturing process of the semiconductor device shown in FIGS. 2A and 2B.

A semiconductor device of the present embodiment includes a semiconductor element 203 including electrode parts 204, and a wiring substrate 208. The wiring substrate 208 includes an insulation layer 201 having an elastic modulus of not less than 0.1 GPa and not more than 5 GPa, electrode-part-connection electrodes 202 provided on one of surfaces of the insulation layer 201, and external electrodes 207 that are connected electrically with the electrode-part-connection electrodes 202. The external electrodes 207 are arranged on the same surface of the insulation layer 201 where the electrode-part-connection electrodes 202 are arranged, as in Embodiment 1. Each of the electrodes parts 204 and the electrode-part-connection electrodes 202 includes a metal layer, and when the electrode parts 204 and the electrode-part-connection electrodes 202 are superposed, their metal layers are in contact with each other. It should be noted that in FIGS. 2A and 2B, the illustration of the metal layers of the electrode parts 204 and the metal layers of the electrode-part-connection electrodes 202 is omitted.

The semiconductor device of the present embodiment also, as in Embodiment 1, is configured so that the wiring substrate 208 includes the insulation layer 201 having an elastic modulus of not less than 0.1 GPa and not more than 5 GPa. Therefore, even if the electrode parts 204 and the electrode-part-connection electrodes 202 are connected directly by metal joint, not via bumps, the wiring substrate 208 including the insulation layer 201 with an elastic modulus of not less than 0.1 GPa and not more than 5 GPa enables the reduction of stresses occurring due to the thermal expansion difference between the semiconductor element 203 and the wiring substrate 208. Therefore, connection reliability can be maintained between the electrode parts 204 and the electrode-part-connection electrodes 202. Thus, with the present embodiment, a thin, low-cost, and highly reliable semiconductor device can be provided.

With the configuration of the present embodiment in particular, since the insulation layer 201 has a thickness of approximately 15 μm to 40 μm, it is possible to provide an extremely thin semiconductor device.

To form the insulation layer 201, for instance, a thermoplastic polyimide film, a thermosetting resin film, etc. can be used.

The thermosetting resin is identical to the thermosetting resin of Embodiment 1 described above that is contained in the mixture of a resin composition containing a thermosetting resin and an inorganic filler.

The electrode-part-connection-electrodes 202 and the external electrodes 207 are formed with the same materials through the same process as those of Embodiment 1 described above.

The bonding of the wiring substrate 208 with the semiconductor element 203 preferably is carried out as follows. First, a coupling treatment is applied to a surface of the semiconductor element 203, and an insulation resin 209 is supplied to the surface of the semiconductor element 203 thus subjected to the coupling treatment. Thereafter, the semiconductor element 203 and the wiring substrate 208 are bonded with each other. This process enhances the adhesion between the semiconductor element 203 and the wiring substrate 208.

The coupling treatment is carried out by dissolving a coupling agent in a solvent so as to have a concentration of 0.1 wt % to 2 wt %, applying the solution over the semiconductor element 203, and drying the same. The application of the solution can be carried out by immersion, spraying, etc. Examples of the coupling agents include aminosilane, epoxysilane, acrylsilane, mercaptosilane, vinylsilane, etc.

Examples of the insulation resin include, for instance, photosensitive polyimide.

In the case where the insulation layer 201 is a thermosetting resin film, the bonding of the semiconductor element 203 with the wiring substrate 208 can be carried out by bonding a film including a thermosetting resin in a non-cured state with the electrode-part-connection electrodes 202 and the external electrode 207 formed therein onto the semiconductor element 203 by thermocompression by using a vacuum laminator or the like, and curing the thermosetting resin.

The semiconductor device of Embodiment 2 also can be manufactured through the following process.

First of all, as shown in FIG. 3A, a semiconductor element 203 provided with electrode parts 204 is prepared, and is attached to a predetermined location on the motherboard 206. On the other hand, as shown in FIG. 3B, a mounting member 91 that includes an insulation member 90, electrode-part-connection electrodes 202 arranged on a surface of the insulation member 90 on one side thereof, and external electrodes 207 connected electrically with the electrode-part-connection electrodes 202 is prepared. It should be noted that in FIG. 3A, the illustration of wiring of the motherboard 206 is omitted, and in FIG. 3B, 210a denotes a line that connects one of the electrode-part-connection electrodes 202 with a corresponding one of the external electrodes 207 and that is included in a wiring layer 210 that includes the electrode-part-connection electrodes 202 and the external electrodes 207.

Next, the mounting member 91 and the motherboard 206 on which the semiconductor element 203 is attached are laminated so that the electrode parts 204 and the electrode-part-connection electrodes 202 are brought into contact with each other. The mounting member 91 and the semiconductor element 203 are bonded with each other, and the external electrodes 207 and the motherboard 206 are connected with each other. Next, the metal layers of the electrodes parts 204 and the metal layers of the electrode-part-connection electrodes 202 are heated using an ultrasonic vibrator so that the electrode parts 204 and the electrode-part-connection electrodes 202 are connected by metal joint. It should be noted that the mounting member 91 bonded with the semiconductor element 203 becomes a wiring substrate 208, while the insulation member 90 becomes an insulation layer 201 (see FIGS. 2A and 2B).

In the case where the insulation member 90 is, for instance, a thermoplastic polyimide film or the like, a coupling treatment is applied to a surface of the semiconductor element 203, and an insulation resin 209 is supplied to the surface of the semiconductor element 203 thus subjected to the coupling treatment. Thereafter, the mounting member 91 and the semiconductor element 203 are bonded with each other. In the case where the insulation member 90 is, for instance, a film containing a thermosetting resin in a non-cured state, the film is heated while pressure is applied thereto partially, so that the mounting member 91 and the semiconductor element 203 are bonded with each other. In the case where the mounting member 91 is a film containing a thermosetting resin in a non-cured state, the mounting member 91 shrinks upon application of heat and pressure and therefore, it is possible to eliminate slack of the mounting member 91 (the insulation layer 201) between the electrode-part-connection electrodes 202 and the external electrodes 207.

Through such a method for manufacturing a semiconductor device, the semiconductor device of the present embodiment is completed, while the semiconductor device of the present embodiment is connected with the motherboard 206.

Embodiment 3

Figure 4:
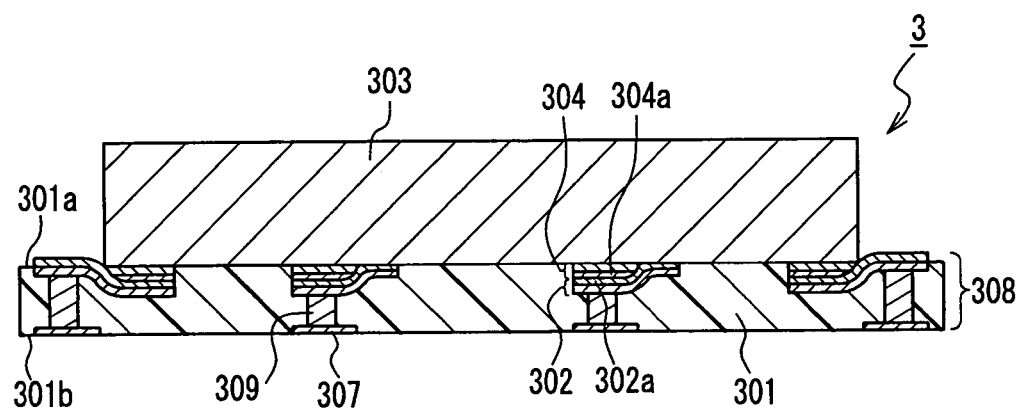
FIG. 4 is a cross-sectional view illustrating another example of a semiconductor device of the present invention.

The following will describe a semiconductor device according to the present embodiment, while referring to FIG. 4. As shown in FIG. 4, a semiconductor device 3 of the present embodiment includes a semiconductor element 303 including electrode parts 304, and a wiring substrate 308. The wiring substrate 308 includes an insulation layer 301 having an elastic modulus of not less than 0.1 GPa and not more than 5 GPa, electrode-part-connection electrodes 302 provided in the insulation layer 301, and external electrodes 307 that are provided in the insulation layer 301 and that are connected electrically with the electrode-part-connection electrodes 302.

Each electrode part 304 includes a metal layer 304a, and each electrode-part-connection electrode 302 includes a metal layer 302a. In the semiconductor device 3, the metal layers 304a of the electrode parts 304 and the metal layers 302a of the electrode-part-connection electrodes 302 are connected by metal joint.

In the semiconductor device 3 also, as in Embodiment 1, even if the electrode parts 304 and the electrode-part-connection electrodes 302 are connected directly by metal joint, not via bumps, the wiring substrate 308 including the insulation layer 301 with an elastic modulus of not less than 0.1 GPa and not more than 5 GPa enables the reduction of stresses occurring due to the thermal expansion difference between the semiconductor element 303 and the wiring substrate 308. Therefore, connection reliability can be maintained between the electrode parts 304 and the electrode-part-connection electrodes 302. Further, since the semiconductor device has a structure such that the electrode parts 304 and the electrode-part-connection electrodes 302 are bonded directly without bumps, the reduction of the thickness and the cost of the device can be achieved. Thus, with the present embodiment, a thin, low-cost, and highly reliable semiconductor device can be provided. Still further, in the semiconductor device 3, as in Embodiment 1, since the surface of the wiring substrate 308 on the semiconductor element side and the surface of the semiconductor element 303 on the wiring substrate side are bonded with each other in a manner such that spaces between the electrode parts 304 are filled with the insulation layer 301, stresses occurring due to the thermal expansion difference between the semiconductor element and the wiring substrate can be reduced.

In the semiconductor device 3, the electrode-part-connection electrodes 302 are provided in the insulation layer 301, and the external electrodes 307 are provided on a surface 301b of the insulation layer 301 that is opposite to a surface 301a thereof on the semiconductor element side. The electrode-part-connection electrodes 302 and the external electrodes 307 are connected electrically with each other through inner vias 309 that are provided in the insulation layer 301 so as to go through the insulation layer 301 in a thickness direction thereof Thus, with the configuration of the wiring substrate 308 in which the electrode-part-connection electrodes 302 and the external electrode 307 are connected electrically with each other through the inner vias 309 provided in the insulation layer 303, it is possible to provide a semiconductor device with a high degree of freedom in wiring layout. Further, since the external electrodes 307 can be arranged in an area array style, the semiconductor device can be downsized. It should be noted that since the surface of the wring substrate 308 on the semiconductor element side is larger than the surface of the semiconductor element 303 on the wiring substrate side in the example shown in FIG. 4, a periphery of the wiring substrate 308 protrudes out of the semiconductor element 303, but the protruded portion desirably is reduced as much as possible from the viewpoint of downsizing the semiconductor device.

The inner vias 309 are made of a conductive material, for instance, a conductive resin composition, and as such a conductive resin composition, for instance, a conductive paste containing a metal powder, a thermosetting resin, and a curing agent can be used. As the metal powder, for instance, at least one kind of metal selected from the group consisting of gold, silver, copper, palladium, and nickel is used preferably. By using such a metal, the electrode-part-connection electrodes 302 and the external electrodes 307 can be connected electrically with a low resistance. As the thermosetting resin and the curing agent, for instance, an epoxy resin and imidazol can be used, respectively.

In the semiconductor device 3, the semiconductor element 303 has a mechanical characteristic of flexibility since the semiconductor element 303 has a thickness of not less than 30 µm and not-more than 100 µm. This semiconductor element 303, in combination with the wring substrate 308 including the insulation layer 301 with an elastic modulus of not less than 0.1 GPa and no more than 5 GPa, is capable of reducing stresses that occur due to a thermal expansion difference between the semiconductor element 303 and the wiring substrate 308, and therefore, enhances the connection reliability of the semiconductor device. It should be noted that the semiconductor element 303 can be processed easily so as to have a desired reduced thickness without damaging the circuit formed on a surface of the semiconductor element 303 as long as the thickness is not less than 30 µm.

In the semiconductor device 3, since the thickness of the insulation layer 301 is not less than 30 µm and not more than 200 µm, an overall thickness of the semiconductor device can be set to be not less than 60 µm and not more than 300 µm. By thus reducing the overall thickness of the semiconductor device to not less than 60 µm and not more than 300 µm, the semiconductor device as a whole is made more flexible, and the connection reliability of a module in which such a semiconductor device 3 is mounted can be enhanced.

Further, since the thickness of the semiconductor device 3 is significantly small, the semiconductor device 3 is suitable as a component for use in a circuit component built-in module that incorporates a circuit component in a substrate thereof.

Embodiment 4

Figure 5A:
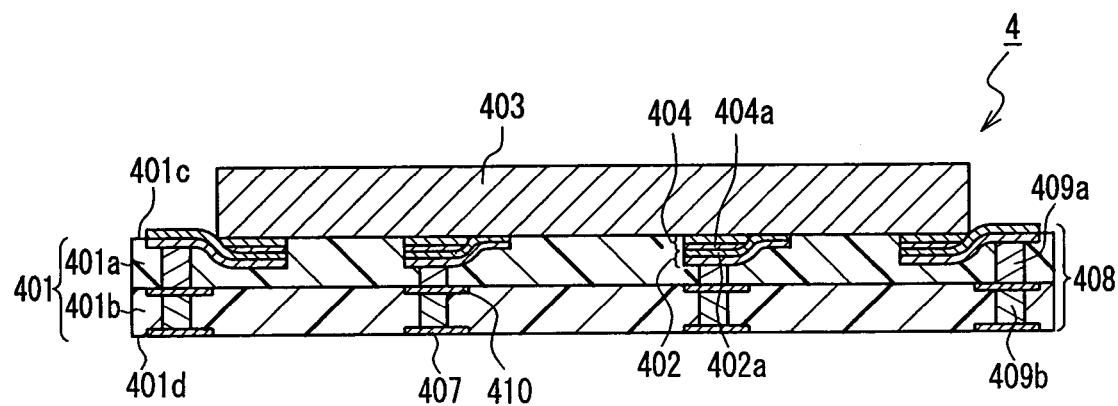
FIG. 5A is a cross-sectional view illustrating still another example of a semiconductor device of the present invention.
Figure 5B:
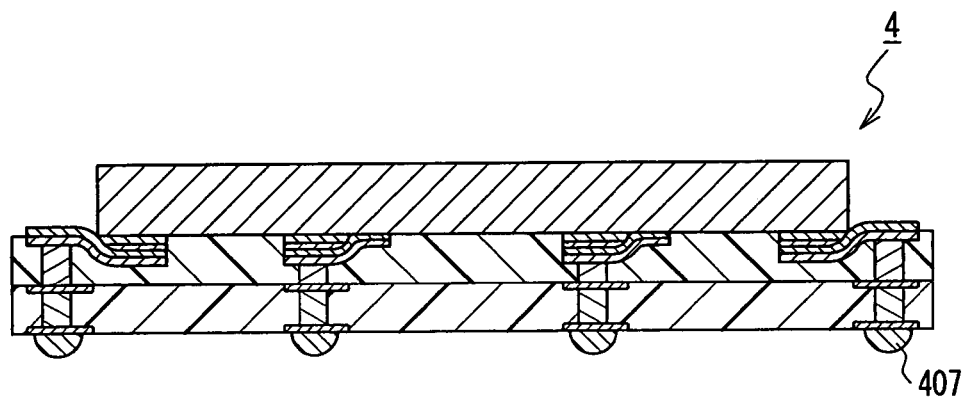
FIG. 5B is a cross-sectional view illustrating still another example of a semiconductor device of the present invention.

The following will describe a semiconductor device 4 according to Embodiment 4, while referring to FIGS. 5A and 5B. As shown in FIG. 5A, as in Embodiments 1 to 3, the semiconductor device 4 includes a semiconductor element 403 including electrode parts 404, and a wiring substrate 408. Metal layers 404a of the electrode parts 404 and metal layers 402a of electrode-part-connection electrodes 402 are connected by metal joint.

The wiring substrate 408 includes: an insulation layer 401 that includes an upper insulation layer 401a and a lower insulation layer 401b and that has an elastic modulus of not less than 0.1 GPa and no more than 5 GPa; electrode-part-connection electrodes 402 provided in the insulation layer 401; and external electrodes 407 that are provided on a surface 401d of the insulation layer 401 opposite to a surface 401c thereof on the semiconductor element 403 side. Further, the wiring substrate 408 includes a wiring layer 410 arranged between the upper insulation layer 401a and the lower insulation layer 401b, and inner vias 409a and 409b that connect electrically the electrode-part-connection electrodes 402 with the external electrodes 407. In other words, the wiring substrate 408 has a multilayer wiring structure. Thus, by forming the wiring substrate 408 in the multilayer wiring structure, the degree of freedom in wiring layout can be increased further. Moreover, since the external electrodes 407 can be arranged in an area array style, the semiconductor device can be downsized.

In the semiconductor device 4 also, as in Embodiment 1, even if the electrode parts 404 and the electrode-part-connection electrodes 402 are connected directly by metal joint, not via bumps, the wiring substrate 408 including the insulation layer 401 with an elastic modulus of not less than 0.1 GPa and not more than 5 GPa enables the reduction of stresses occurring due to the thermal expansion difference between the semiconductor element 403 and the wiring substrate 408. Therefore, connection reliability can be maintained between the electrode parts 404 and the electrode-part-connection electrodes 402. Further, since the semiconductor device has a structure such that the electrode parts 404 and the electrode-part-connection electrodes 402 are bonded without bumps, the reduction of the thickness and the cost of the device can be achieved. Thus, with the present embodiment, a thin, low-cost, and highly reliable semiconductor device can be provided.

Still further, since the semiconductor device 4 is, as in Embodiments 1 and 3, configured so that the surface of the wiring substrate 408 on the semiconductor element side and the surface of the semiconductor element 403 on the wiring substrate side are bonded with each other in a manner such that spaces between the electrode parts 404 are filled with the insulation layer 401, stresses occurring due to the thermal expansion difference between the semiconductor element 403 and the wiring substrate 408 can be reduced more effectively.

In the semiconductor device 4 also, as in Embodiment 3, since the semiconductor element 403 has a thickness of not less than 30 µm and not more than 10 µm and each of the upper and lower insulation layers 401a and 401b has a thickness of not less than 30 µm and not more than 100 µm, an overall thickness of the semiconductor device can be set to be not less than 90 µm and not more than 300 µm. In the semiconductor device 4 of the present embodiment also, for the same reason as that of Embodiment 3, the connection reliability of a module in which such a semiconductor device 4 is mounted can be enhanced, and the semiconductor device 4 is suitable as a component for use in a circuit component built-in module. It should be noted that since the surface of the wring substrate 408 on the semiconductor element side is larger than the surface of the semiconductor element 403 on the wiring substrate side in the example shown in FIG. 5A, a periphery of the wiring substrate 408 protrudes out of the semiconductor element 403, but the protruded portion desirably is reduced as much as possible from the viewpoint of downsizing the semiconductor device.

Though the wiring substrate 408 is configured so that one wiring layer 410 is provided in the insulation layer 401 in the semiconductor device 4, the wiring substrate 408 is not limited to this configuration. Two or more wiring layers may be provided in the insulation layer 401.

Though the semiconductor device 4 shown in FIG. 5A has a land grid array (LGA) structure, the semiconductor device of the present embodiment may have the ball grid array (BGA) structure as shown in FIG. 5B. However, in the case where the semiconductor element 403 has an area (an area of a surface thereof crossing the thickness direction perpendicularly) of not less than 5 mm$^2$, for instance, approximately 10 mm$^2$, the semiconductor device preferably has the BGA structure, which is excellent in secondary mounting with respect to a motherboard. In the case where the semiconductor element 403 has an area of less than 5 mm$^2$ and is used for a purpose in which the semiconductor device is required to be thinner, the LGA structure (FIG. 5A) is preferable.

Embodiment 5

Figure 6:
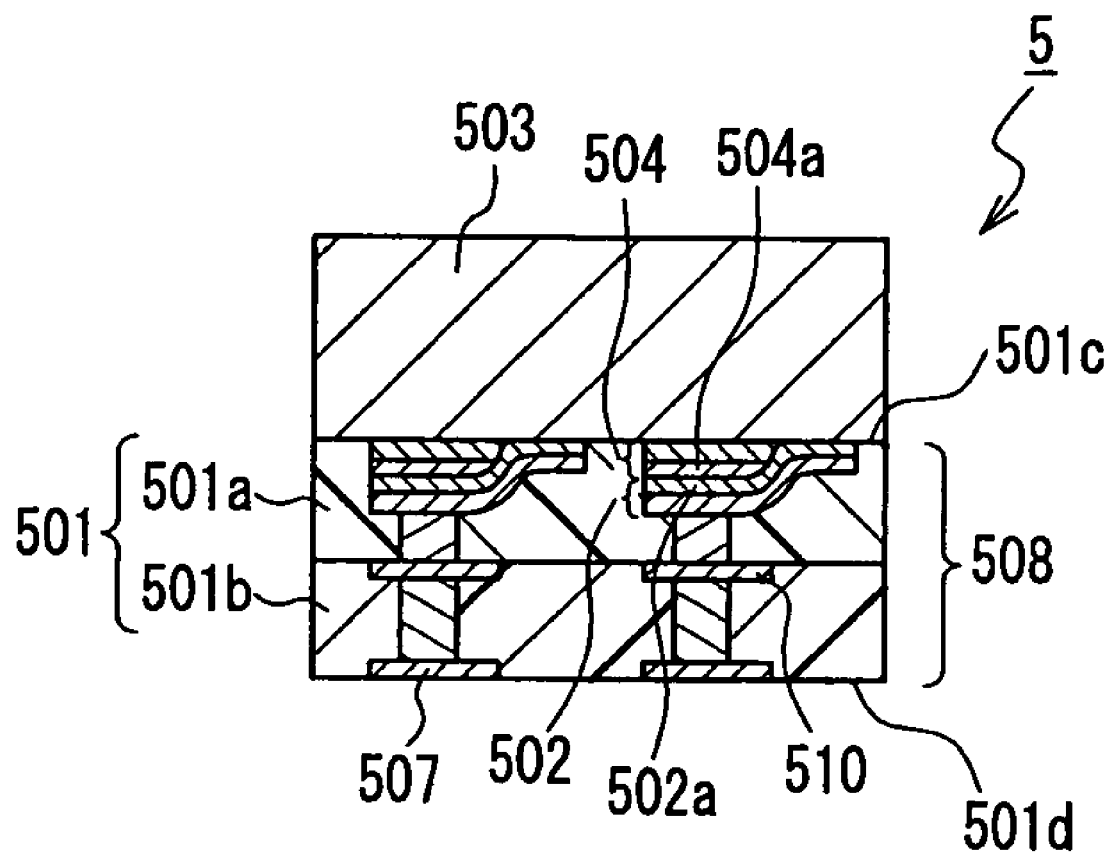
FIG. 6 is a cross-sectional view illustrating still another example of a semiconductor device of the present invention.

The following will describe a semiconductor device according to the present embodiment, while referring to FIG. 6. As shown in FIG. 6, the semiconductor device 5 includes a semiconductor element 503 including electrode parts 504, and a wiring substrate 508. As in Embodiment 4, the wiring substrate 508 has a multilayer wiring structure including: an insulation layer 501 that includes an upper insulation layer 501a and a lower insulation layer 501b and that has an elastic modulus of not less than 0.1 GPa and no more than 5 GPa; electrode-part-connection electrodes 502 provided in the insulation layer 501; external electrodes 507 that are provided on a surface 501d of the insulation layer 501 opposite to a surface 501c thereof on the semiconductor element 503 side; and a wiring layer 510 arranged in the insulation layer 501.

Each electrode part 504 and each electrode-part-connection electrode 502 includes a metal layer 504a and a metal layer 502a, respectively, and in the semiconductor device 5, the metal layers 504a of the electrode parts 504 and the metal layers 502a of the electrode-part-connection electrodes 502 are connected by metal joint.

In the semiconductor device 5 also, as in Embodiment 1, even if the electrode parts 504 and the electrode-part-connection electrodes 502 are connected directly by metal joint, not via bumps, the wiring substrate 508 including the insulation layer 501 with an elastic modulus of not less than 0.1 GPa and not more than 5 GPa enables the reduction of stresses occurring due to the thermal expansion difference between the semiconductor element 503 and the wiring substrate 508. Therefore, connection reliability can be maintained. Further, since the semiconductor device has a structure such that the electrode parts 504 and the electrode-part-connection electrodes 502 are bonded directly without bumps, the reduction of the thickness and the cost of the device can be achieved. Thus, with the present embodiment, a thin, low-cost, and highly reliable semiconductor device can be provided.

The semiconductor device 5 is manufactured by a so-called wafer level packaging technology whereby a plurality of semiconductor elements are packaged together at a wafer level, and an area of a surface of the wiring substrate 508 on the semiconductor element side (an area of a surface thereof crossing the thickness direction perpendicularly) and an area of a surface of the semiconductor element 503 on the wiring substrate side (an area of a surface thereof crossing the thickness direction perpendicularly) are equal to each other. Therefore, the degree of freedom in wiring layout is inferior to that of the semiconductor device 4 of Embodiment 4, but a further downsized semiconductor device can be provided.

It should be noted that though the wiring substrate 508 is configured so that one wiring layer 510 is provided in the insulation layer 501 in the present embodiment, the wiring substrate is not limited to this configuration. It may be configured, without including a wiring layer inside, so that the electrode-part-connection electrodes 504 and the external electrodes 507 are connected directly through inner vias arranged in the insulation layer 501. Alternatively, two or more wiring layers may be provided in the insulation layer 501.

Embodiment 6

Figure 7A:
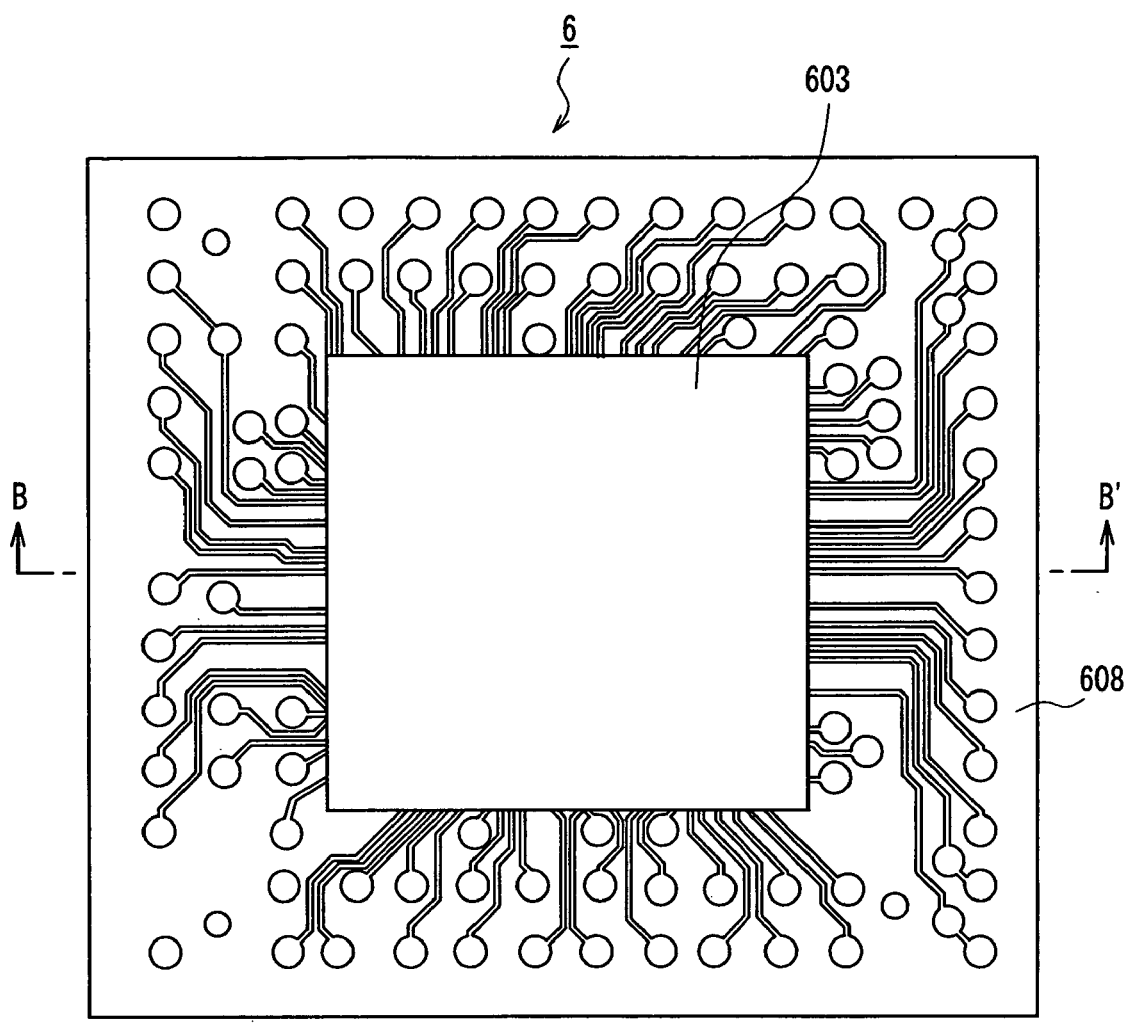
FIG. 7A is a plan view illustrating still another example of a semiconductor device of the present invention.
Figure 7B:
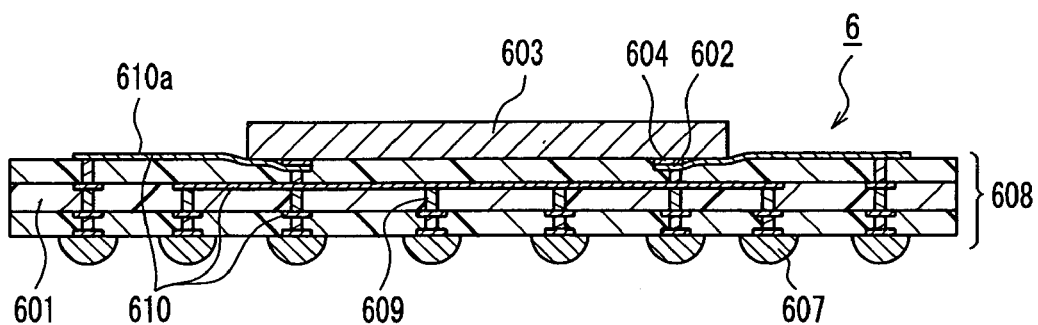
FIG. 7B is a cross-sectional view of the semiconductor device shown in FIG. 7A, taken along a line B–B'.
Figure 8A:
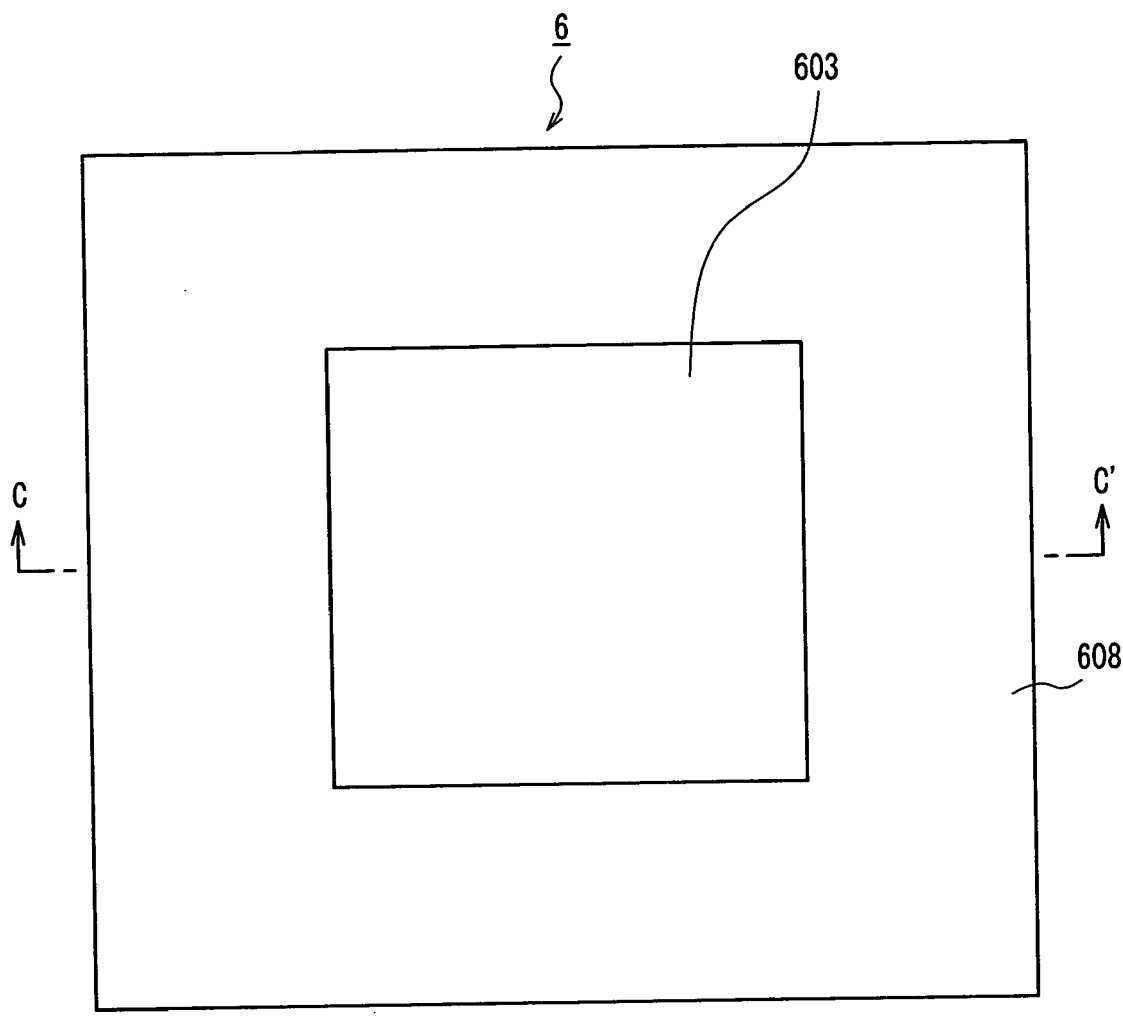
FIG. 8A is a plan view illustrating still another example of a semiconductor device of the present invention.
Figure 8B:
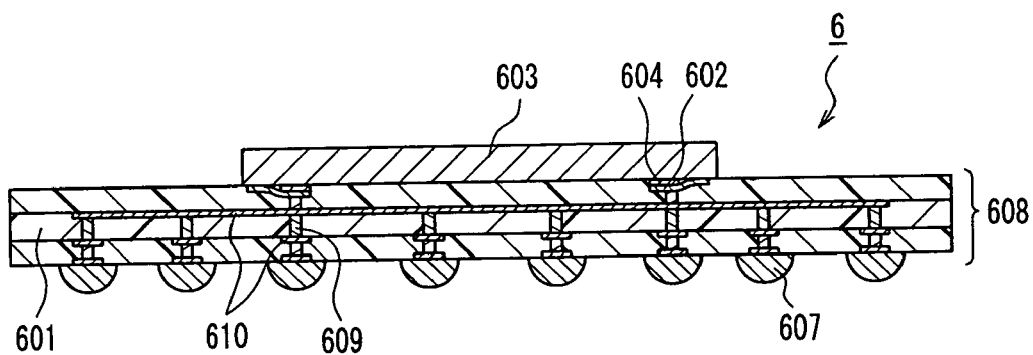
FIG. 8B is a cross-sectional view of the semiconductor device shown in FIG. 8A, taken along a line C–C'.

The following will describe a semiconductor device according to Embodiment 6, while referring to FIGS. 7A to 8B. FIGS. 7A and 8A are plan views of the semiconductor device of the present embodiment, and FIGS. 7B and 8B are cross-sectional views of the semiconductor device of the present embodiment.

As shown in FIGS. 7A to 8B, a semiconductor device 6 of the present embodiment is identical to the semiconductor device of Embodiment 4 (FIG. 5B) except that two wiring layers 610 are provided in an insulation layer. It should be noted that in FIGS. 7A to 8B, 603 denotes a semiconductor element, 604 denotes an electrode part of the semiconductor element 603, 608 denotes a wiring substrate, 602 denotes an electrode-part-connection electrode, 607 denotes an external electrode, 601 denotes an insulation layer, 610 denotes a wiring layer, 610a denotes a line composing the wiring layer 610, and 609 denotes an inner via. It should be noted that in FIGS. 7B and 8B, the illustration of metal layers included in the electrode parts 604 and metal layers included in the electrode-part-connection electrodes 602 is omitted.

For instance, in the semiconductor device of a wafer level package structure, a region where lines for connecting the electrode-part-connection electrodes with the external electrodes are arranged (rewiring region) is determined according to the size of the semiconductor element. Therefore, it is difficult to manufacture a semiconductor device of the wafer level package structure employing a semiconductor element having, for instance, not less than 100 pins of electrode parts (pad electrodes), since a rewiring region thereof is small relative to the number of electrode parts thereof. Besides, in recent years, a semiconductor element is downsized increasingly as the minimum conductive unit width, etc., determined according to the wiring rule is narrowed, and the size of a rewiring region thereof is decreased. As shown in FIGS. 7A to 8B, by making a surface of the wiring substrate 608 crossing a thickness direction of the semiconductor device 6 perpendicularly larger than a surface of the semiconductor element 603 crossing the thickness direction of the semiconductor device 6 perpendicularly, the lines 610a can be provide so as to extend from the electrode parts (pad electrodes) 604 of the semiconductor element 603 to the periphery of the semiconductor element 603. With this configuration, a semiconductor device employing a semiconductor element having a greater number of electrode parts (pad electrodes) 604 can be provided.

However, as shown in FIG. 7B, in the case where many lines 610*a* are provided on a surface of the insulation layer 601 on the semiconductor element side, it is preferable to provide as many lines 610*a* on a surface of the insulation layer 601 that is seen when the semiconductor device 6 is observed in the thickness direction of the semiconductor device 6 from the semiconductor element 603 side as possible, that is, on an area of the surface of the insulation layer 601 that is not in contact with the semiconductor element 603. It should be noted that without providing many wires on the surface of the insulation layer 610 on the semiconductor element side, lines can be provided in the insulation layer 601 freely, as shown in FIG. 8B. Either the structure shown in FIGS. 7A and 7B or the structure shown in FIGS. 8A and 8B is selected according to the purpose of use.

Embodiment 7

Embodiment 7 relates to a method for manufacturing the semiconductor device 1 of Embodiment 1 described above, which is described below with reference to FIGS. 9A to 9E.

Figure 9A:
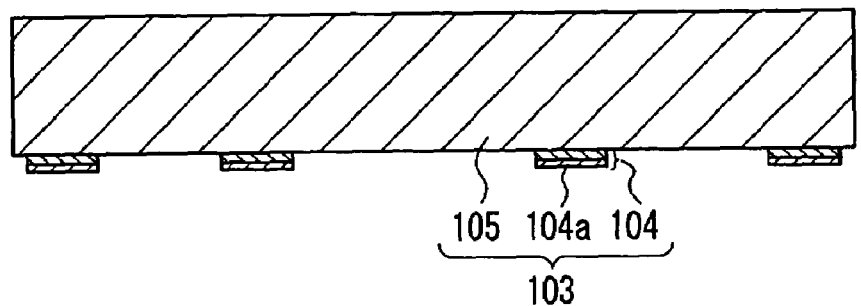
FIGS. 9A to 9E are views illustrating an example of a process for manufacturing a semiconductor device shown in FIG. 1.

As shown in FIG. 9A, the semiconductor element 103 including the electrode parts 104 is prepared. The electrode parts 104 protrude from a surface of the body part 105 on one side (a surface thereof to be bonded with the wiring substrate), and include the metal layers (Au layers) 104*a*. The metal layers 104 are formed by plating.

Figure 9B:
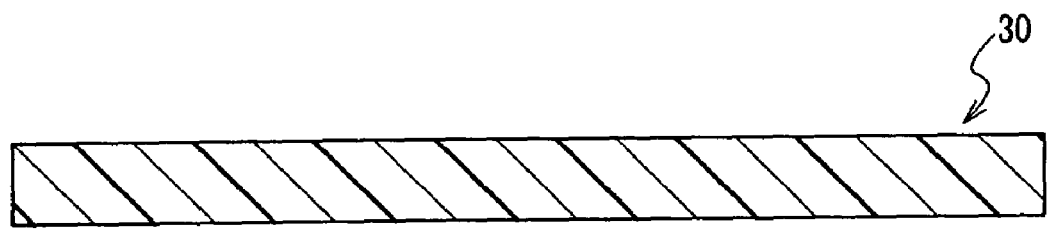

Next, as shown in FIG. 9B, a sheet-like insulation member 30 is formed using a material containing a thermosetting resin in a non-cured state through a process described below. The material containing a thermosetting resin in a non-cured state is identical to the material of the insulation layer of Embodiment 1 described above. The material containing a thermosetting resin in a non-cured state contains, in terms of a composition containing a solvent, for instance, 73.8 wt % to 91 wt % of an inorganic filler, 8.8 wt % to 25 w % of a resin composition containing a thermosetting resin, and 0.2 wt % to 1.2 wt % of a solvent.

First, a mixture slurry containing an inorganic filler, a resin composition containing a thermosetting resin, a solvent having a boiling point of not lower than 150° C., and a solvent having a boiling point of not higher than 100° C. is prepared, and a film is formed with this mixture slurry on a releasing film (not shown). The method for forming the film is not limited particularly, and examples of the same include doctor blading, coater method, extrusion, etc. Next, only the solvent having a boiling point of not higher than 100° C. is removed by drying from the film thus formed. By so doing, the insulation member 30 in a non-cured state having flexibility is formed.

Next, a wiring pattern 31 is formed on the insulation member 30, while the non-cured state of the insulation member 30 is maintained. The wiring pattern 31 includes the electrode-part-connection electrodes and the external electrodes (see FIG. 1). Examples of the method for forming the wiring pattern 31 include the subtractive method, transferring, and the additive method.

Figure 9C:
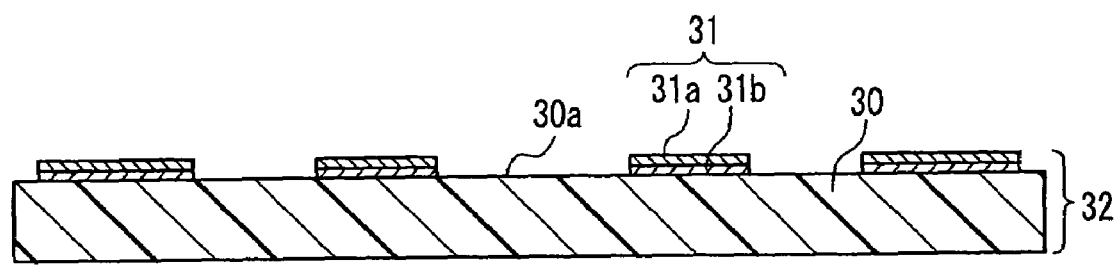

In the present embodiment, for instance, a copper foil with a thickness of 9 μm is laminated on a surface 30*a* of the insulation member 30 on one side thereof at 100° C., and after pressure application thereto, unnecessary portions thereof are removed, whereby a wiring pattern 31*b* is formed. Thereafter, it is subjected to electroless plating so that the protruded wiring pattern 31 including metal layers (Au layers) 31*a* is formed. Thus, a mounting member 32 as shown in FIG. 9C is formed. By forming the wiring pattern 31 so that it protrudes from the surface 30*a* as described above, the pressure applied upon the metal joint of the metal layers 102*a* of the electrode-part-connection electrodes 102 and the metal layer 104*a* of the electrode parts 104 is applied accurately to an interface where the electrode-part-connection electrodes 102 and the electrode parts 104 are in contact with each other. Therefore, the electrode-part-connection electrodes 102 and the electrode parts 104 are bonded firmly with each other (see FIG. 1).

It should be noted that in the present embodiment, the insulation member 30 has to be immersed in chemical solutions after the wiring pattern 31*b* is formed by removing unnecessary portions from the copper foil, and after the metal layers (Au layers) 31*a* are formed by electroless plating. Therefore, after immersing the insulation member 30 in chemical solutions, it is necessary to perform the water washing and drying of the insulation member 30 sufficiently.

Figure 9D:
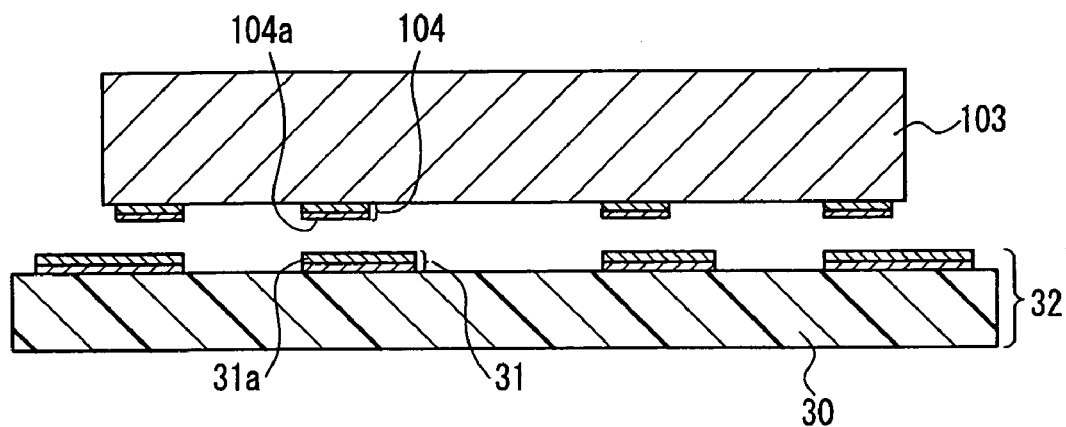

Next, as shown in FIG. 9D, the mounting member 32 and the semiconductor element 103 are superposed on each other so that the electrode parts 104 and predetermined portions of the wiring pattern 31 are in contact with each other, and surfaces at which the metal layers (Au layers) 104*a* of the electrode parts 104 and the metal layers (Au layers) 31*a* of the wiring pattern 31 are in contact with each other are bonded by metal joint by heating the same with supersonic vibration, while pressure is applied thereto in the thickness direction. Here, since the mounting member 32 is in the non-cured state, the ultrasonic wave tends to be absorbed easily by the mounting member 32. Therefore, it is necessary to increase the frequency of the vibration. It should be noted that before the mounting member 32 and the semiconductor element 103 are superposed on each other, surfaces of the electrode parts 104 and the wiring pattern 31 preferably are subjected to plasma cleaning so as to be cleaned.

Next, the laminate composed of the mounting member 32 and the semiconductor element 103 is heated and subjected to pressure in its thickness direction so that portions of the wiring pattern 31 bonded with the electrode parts 104 (electrode-part-connection electrodes) and the electrode parts 104 are embedded in the insulation member 30, and the insulation member 30 is cured. By so doing, the semiconductor element 103 and the mounting member 32 are bonded with each other.

Figure 9E:
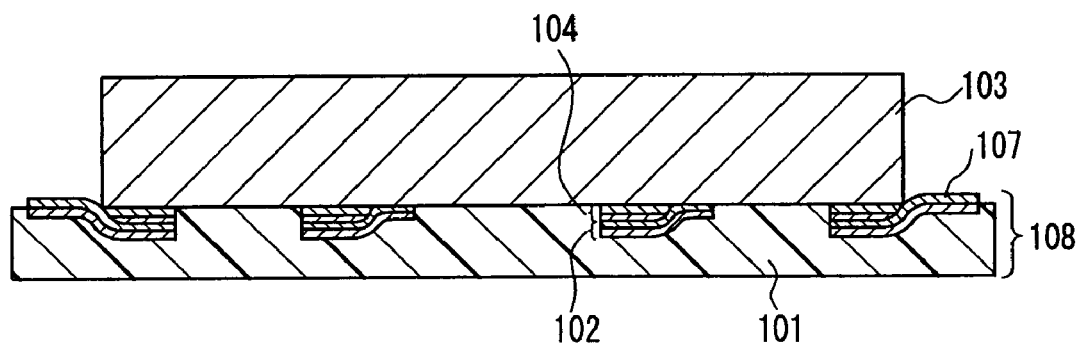

Subsequently, the releasing film (not shown) is removed from the cured insulation member 30. As shown in FIG. 9E, the cured insulation member 30 becomes the insulation layer 101, and the mounting member 32 becomes the wiring substrate 108. The portions of the wiring pattern 31 that are bonded with the electrode parts 104 and embedded in the insulation layer 101 are the electrode-part-connection electrodes 102, and the external electrodes 107 are included in portions of the wiring pattern 31 that are not bonded with the semiconductor element 103.

Figure 10A:
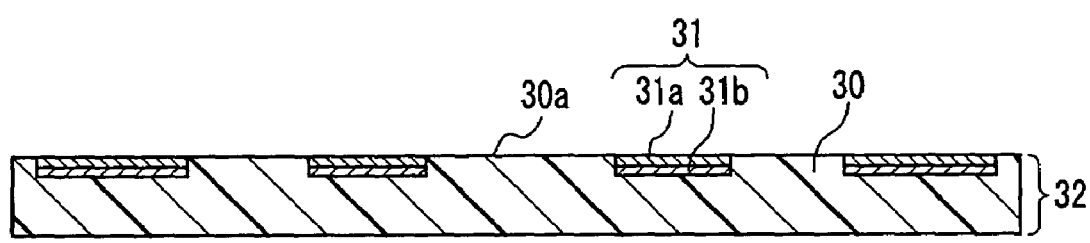
FIGS. 10A and 10B are views illustrating other processes regarding the step shown in FIG. 9C.
Figure 10B:
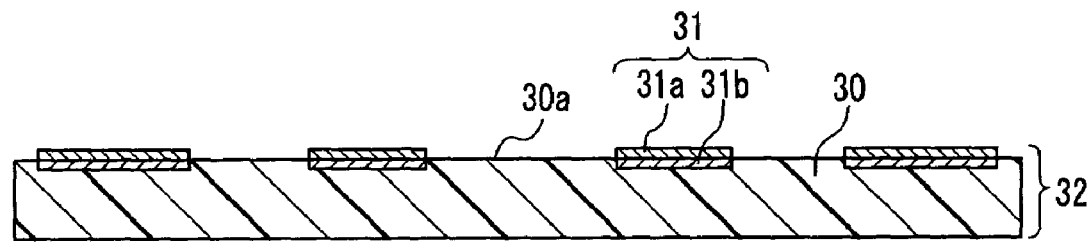

It should be noted that in the step described with reference to FIG. 9C, the wiring pattern 31 is formed so as to protrude from the surface 30*a* of the insulation member 30 on one side, but the configuration thereof is not limited to this. For instance, the wiring pattern 31 may be embedded in the insulation member 30 so that a surface including the wiring pattern 31 and the surface 30*a* of the insulation member 30 on one side is substantially flat as shown in FIG. 10A, or alternatively, the wiring pattern 31 may be embedded partially in the insulation member 30, as shown in FIG. 10B. In such cases, a transfer carrier provided with the wiring pattern 31 thereon and the insulation member 30 are aligned and superposed on each other, and the wiring pattern 31 is transferred onto the insulation member 30 so that an entirety or a part of the wring pattern 31 is embedded in the insulation member 30.

Further, in the step described with reference to FIG. 9D, pressure is applied to the semiconductor element 103 and the mounting member 32 so that the semiconductor element 103 and the mounting member 32 are brought into close contact with each other, whereby the electrode-part-connection electrodes 102 and the electrode parts 104 are embedded in the insulation member 30 (see FIG. 9E). In the case where the semiconductor element 103 thus includes a plurality of electrode parts 104, and the semiconductor element 103 and the wiring substrate 108 are bonded with each other in a manner such that spaces between the electrode parts are filled with the insulation layer 101, stresses occurring due to the thermal expansion difference between the semiconductor element and the wiring substrate are reduced more effectively, whereby a thinner semiconductor device can be provided.

Still further, in the step described with reference to FIG. 9D, after the thermosetting resin contained in the insulation member 32 is cured by applying heat and pressure in the thickness direction to the laminate composed of the mounting member 32 and the semiconductor element 103, the metal layers 104a of the electrode parts 104 and the metal layer 31a of the wiring pattern 31 may be heated using ultrasonic vibration. By applying ultrasonic wave after the thermosetting resin is cured, the ultrasonic vibration is transmitted easily to the metal layers 104a of the electrode parts 104 and the metal layers 31a of the wiring pattern 31, whereby metal joint can be carried out easily and stably.

Embodiment 8

The present embodiment relates to a method for manufacturing the semiconductor device 3 shown in FIG. 4, which is described below with reference to FIGS. 11A to 11F, and 12A and 12B.

Figure 11A:
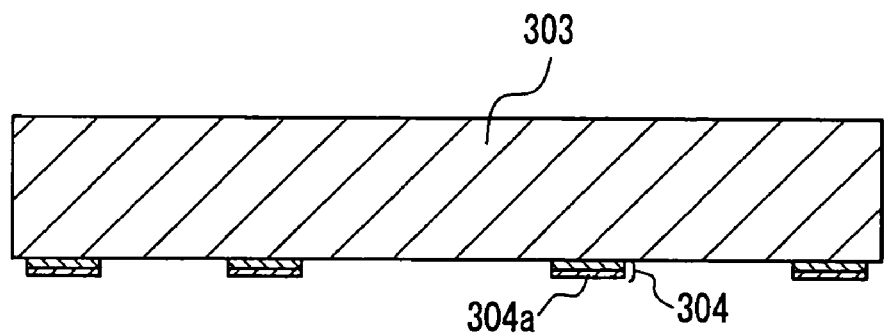
FIGS. 11A to 12B are views illustrating an example of a process for manufacturing the semiconductor device shown in FIG. 4.

First of all, as shown in FIG. 11A, the semiconductor element 303 including the electrode parts 304 is prepared. The electrode parts 304 protrude from a surface of a body part on one side, and include the metal layers (Au layers) 304a. The metal layers 304a are formed by plating.

Figure 11B:
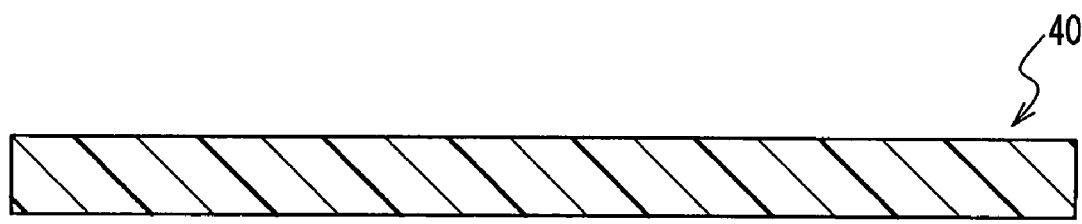

Next, as shown in FIG. 11B, a sheet-like insulation member 40 is formed using a material containing a resin composition containing a thermosetting resin in a non-cured state and an inorganic filler. The material containing a resin composition containing a thermosetting resin in a non-cured state and an inorganic filler is identical to the material of the insulation layer of Embodiment 1 described above.

Figure 11C:
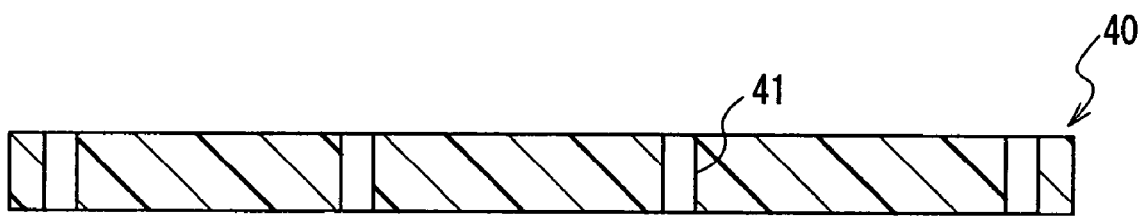
Figure 11D:
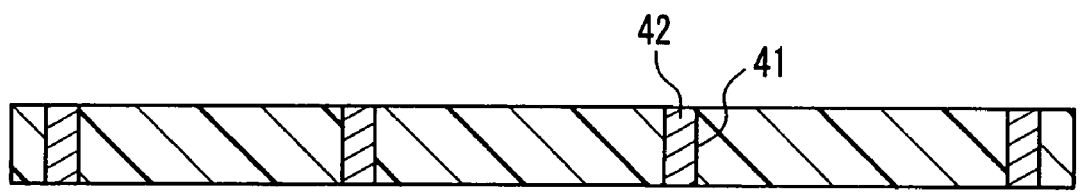

Subsequently, as shown in FIG. 11C, through holes 41 are formed in the insulation member 40. The through holes 41 are formed by, for instance, laser processing using carbon dioxide laser, excimer laser, or the like, drilling, punching, etc. The laser processing is particularly preferable since it is easy and highly accurate. Then, as shown in FIG. 11D, a conductive material such as a conductive resin composition 42 is filled in the through holes 41. It should be noted that the conductive resin composition 42 is identical to the material of the inner vias of Embodiment 3 described above.

Figure 11E:
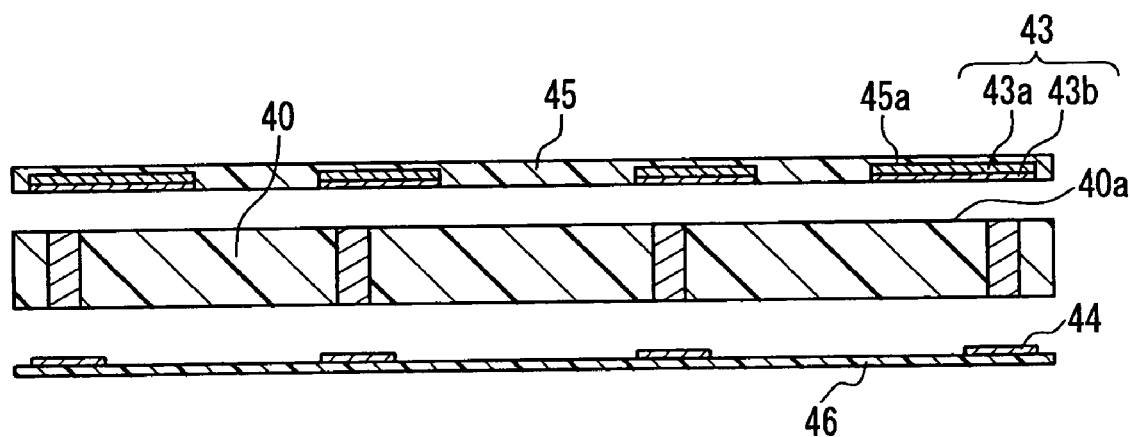
Figure 11F:
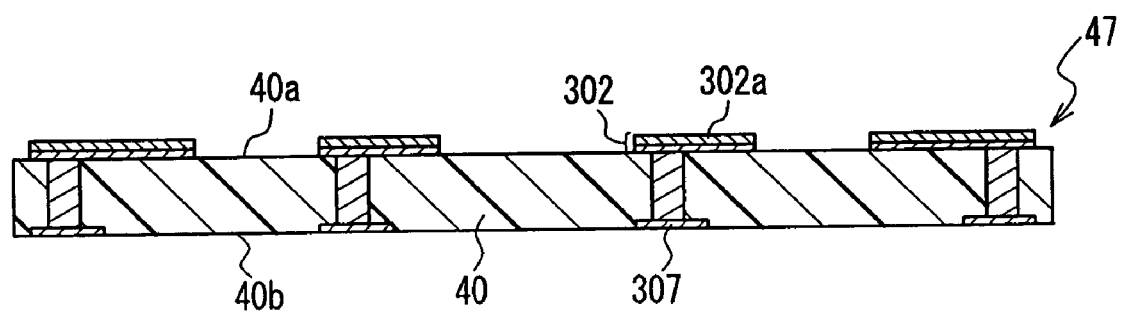

Next as shown in FIG. 11E, transfer carriers 45 and 46 provided with wiring patterns 43 and 44, respectively are prepared. The transfer carriers 45 and 46 are, for instance, resin films or metal foils. It should be noted that the wiring patterns 43 and 44 are formed with a material identical to that of the electrode-part-connection electrodes and that of the external electrodes of Embodiment 1 described above.

The wiring pattern 43 is obtained by, for instance, first, preparing the transfer carrier 45 having recesses 45a, then, forming Au layers 43a in the recesses 45a, and thereafter forming Cu layers 43b thereon. Both of the Au layers 43a and the Cu layers 43b can be formed by the additive method.

By using this transfer carrier 45 provided with the wiring pattern 43, the electrode-part-connection electrodes that include metal layers and protrude out of the insulation member 40 can be formed by superposing the insulation member 40 and the transfer carrier 45 in a manner such that a surface 40a of the insulation member 40 on one side thereof and the wiring pattern 43 face each other, and removing only the transfer carrier 45 while leaving the wiring pattern 43 on the insulation member 40. Additionally, this method does not require, for instance, the step of immersing the insulation member 40 in a chemical solution, which is necessary in the process of manufacturing a semiconductor device according to Embodiment 7. Therefore, the steps of washing with water and drying the insulation member 40 thus immersed in a chemical solution are unnecessary also. Thus, the process can be simplified.

On the other hand, the wiring pattern 44 is formed by, for instance, the subtractive method of laminating a copper foil on a surface of the transfer carrier 46 on one side, applying pressure thereto, and thereafter removing unnecessary portions of the copper foil.

Next, the transfer carriers 45 and 46 provided with the wiring patterns 43 and 44, respectively, and the insulation member 40 are aligned and superposed, and the laminate thus obtained is heated in an atmosphere at approximately 100° C. to 120° C. while a pressure of 3 MPa to 10 MPa is applied thereto, so that the wiring patterns 43 and 44 are transferred to the insulation member 40.

Thus, a mounting member 47 is formed, which has the electrode-part-connection electrodes 302 including the metal layers (Au layers) 302a provided on the surface 40a of the insulation member 40 on one side thereof, and the external electrodes 307 provided on a surface 40b of the insulation member 40 on an opposite side thereof, and contains a thermosetting resin in a non-cured state (see FIG. 1F).

Figure 12A:
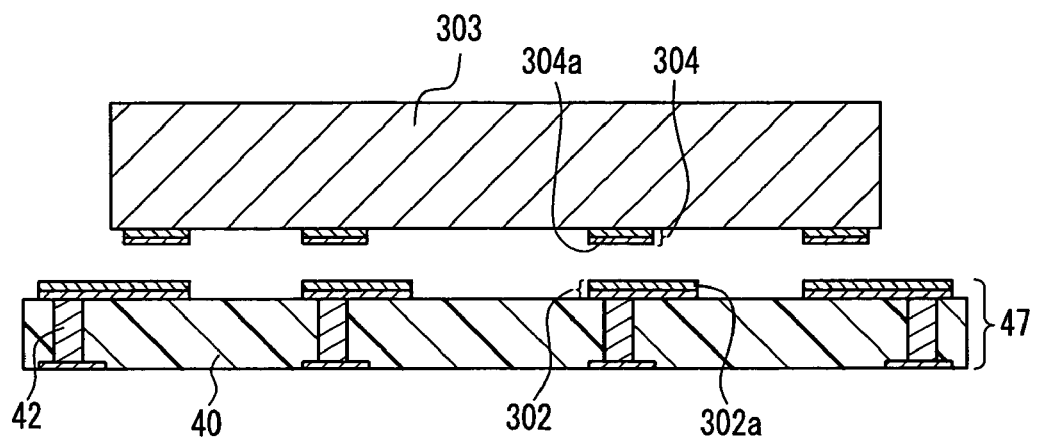

Subsequently, as shown in FIG. 12A, the semiconductor element 303 and the mounting member 47 are superposed so that the electrode parts 304 and the electrode-part-connection electrodes 302 are brought into contact with each other, and while applying pressure thereto in the thickness direction, surfaces at which the metal layers (Au layers) 304a of the electrodes parts 304 and the metal layers (Au layers) 302a of the electrode-part-connection electrodes 302 are brought into contact with each other are heated using ultrasonic vibration so as to be bonded. Here, since the mounting member 47 is in a non-cured state, ultrasonic wave tends to be absorbed by the mounting member 47. Therefore, the frequency of vibration has to be increased.

Figure 12B:
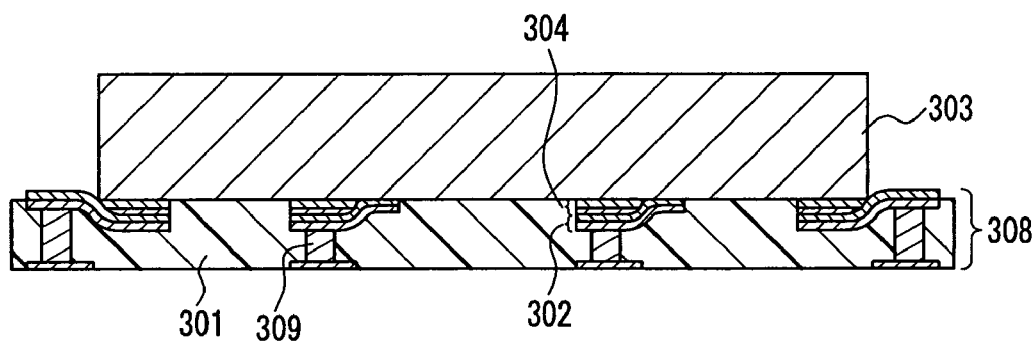

Next, by heating the laminate composed of the mounting member 47 and the semiconductor element 303 while applying pressure thereto in its thickness direction, the electrode-part-connection electrodes 302 and the electrode parts 304 are embedded in the insulation member 40, and the insulation member 40 and the conductive resin composition 42 are cured, whereby the semiconductor element 303 and the mounting member 47 are bonded with each other. As shown in FIG. 12B, the cured insulation member 40 becomes the insulation layer 301, the cured conductive resin composition 42 becomes inner vias 309, and the mounting member 47 becomes the wiring substrate 308.

With the present embodiment, it is possible to manufacture a thin and highly reliable semiconductor device with a high degree of freedom in wiring layout.

Figure 13:
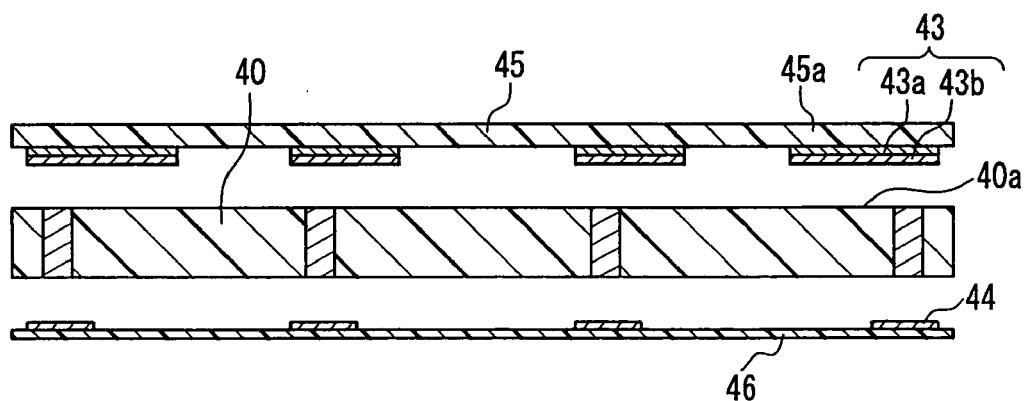
FIG. 13 is a view illustrating another process regarding the step shown in FIG. 11E.

It should be noted that though in the step described with reference to FIG. 11E, the wiring pattern 43 is formed using the transfer carrier 45 having recesses 45a at predetermined positions, the configuration is not limited to this. As shown in FIG. 13, a protruded wiring pattern 43 may be formed on the transfer carrier 45 having a flat surface. In this case, the Au layers 43a and the Cu layers 43b are formed by, for instance, the subtractive method. Subsequently, the transfer carrier 45 provided with the wiring pattern 43 and the insulation member 40 are aligned and superposed, and the wiring pattern 43 is transferred onto the insulation member 40 in a manner such that an entirety or a part of the wiring pattern 43 is embedded in the insulation member 40. Further, the semiconductor device 6 of Embodiment 6 can be manufactured by the semiconductor device manufacturing method according to the present embodiment.

Embodiment 9

The present embodiment relates to an example of a method for manufacturing the semiconductor device 4 shown in FIG. 5A, which is described below with reference to FIGS. 14A to 14G, and 15A and 15B.

Figure 14A:
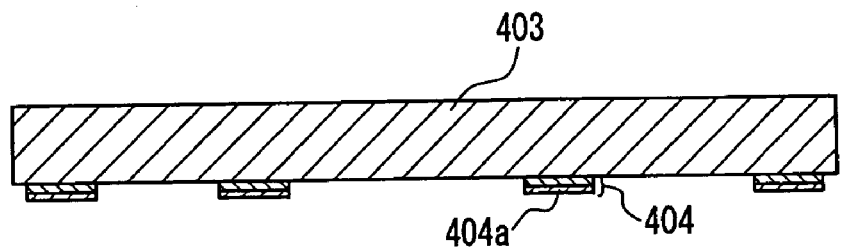
FIGS. 14A to 15B are views illustrating an example of a process for manufacturing the semiconductor device shown in FIG. 5A.

First of all, as shown in FIG. 14A, the semiconductor element 403 including the electrode parts 404 is prepared. The electrode parts 404 protrude from a surface of a body part on one side thereof (a surface to be bonded with the wiring substrate of the semiconductor element 403), and include the metal layers (Au layers) 404a. The metal layers 404a are formed by plating.

Figure 14B:
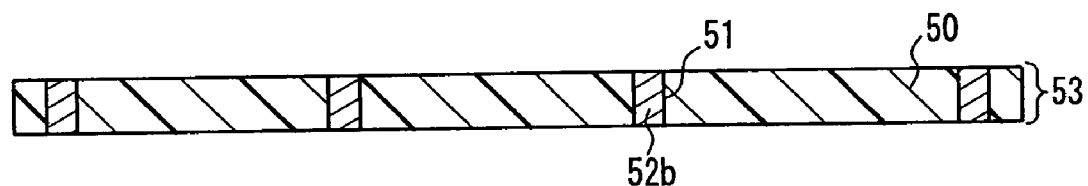

Next, as shown in FIG. 14B, a first sheet-like material 50 having through holes 51 is formed using a material containing a resin composition containing a thermosetting resin in a non-cured state and an inorganic filler. Then, the through holes 51 are filled with a conductive resin composition 52b, whereby a second sheet-like material 53 is formed.

It should be noted that the material of the first sheet-like material 50 is the same as the material of the insulation layer of Embodiment 1 described above. The through holes 51 are formed in the same manner as that described with reference to FIG. 11C. The conductive resin composition 52b is the same as the material of the inner vias of Embodiment 1 described above.

Figure 14C:
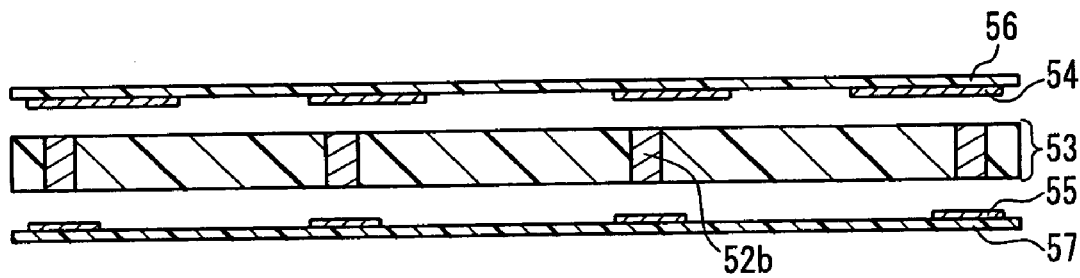
Figure 14D:
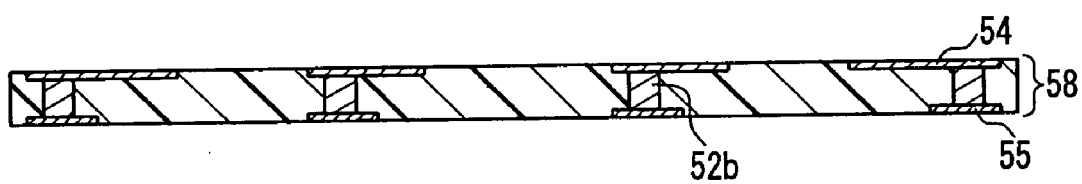

Next, as shown in FIG. 14C, transfer carriers 56 and 57 provided with wiring patterns 54 and 55, respectively, are prepared. Subsequently, the transfer carriers 56 and 57 provided with the wiring patterns 54 and 55, and the second sheet-like material 53 are aligned and superposed, and the laminate thus obtained is heated in an atmosphere at approximately 100° C. to 120° C. while pressure of 3 MPa to 10 MPa is applied thereto, so that the wiring patterns 54 and 55 are transferred to the second sheet-like material 53. By so doing, a third sheet-like material 58 in a non-cured state is obtained, as shown in FIG. 14D.

Figure 14E:
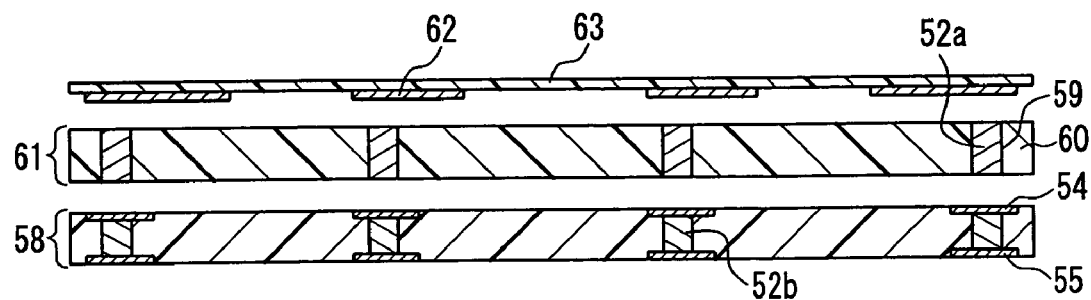

Then, as shown in FIG. 14E, using the same material and method as those of the first sheet-like material, a fourth sheet-like material 60 having through holes 59 is formed, and a conductive resin composition 52a is filled in the through holes 59, whereby a fifth sheet-like material 61 is prepared. It should be noted that the conductive resin composition 52a is the same as the material of the inner vias of Embodiment 1 described above. On the other hand, a transfer carrier 63 provided with a wiring pattern 62 is prepared.

Figure 14F:
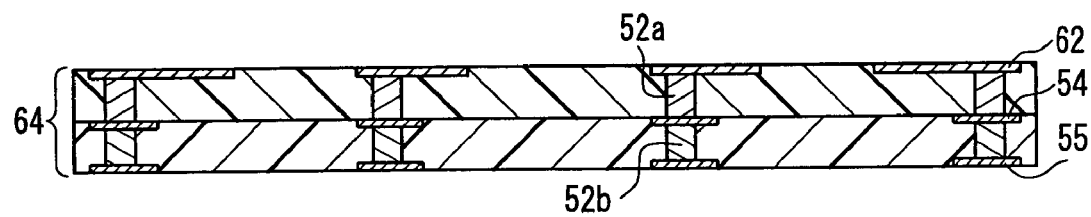
Figure 14G:
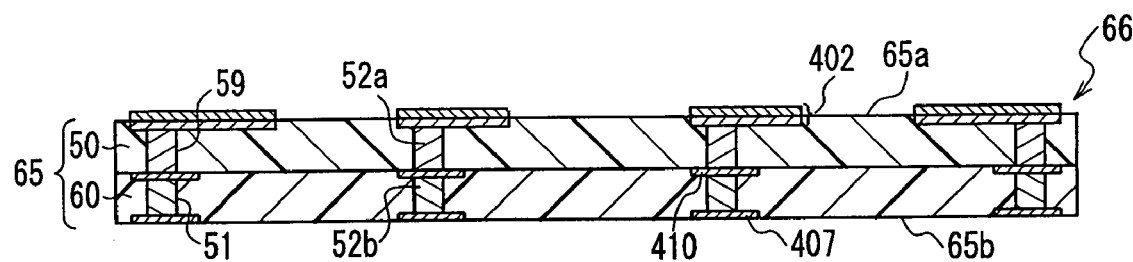

Next, the fifth sheet-like material 61, and the transfer carrier 63 provided with the wiring pattern 62 are aligned and superposed on the third sheet-like material 58 in the stated order, and the laminate thus obtained is heated in an atmosphere of approximately 100° C. to 120° C., while pressure of 3 MPa to 10 MPa is applied thereto. Subsequently, the transfer carrier 63 is removed from the foregoing laminate, whereby a sixth sheet-like material 64 in a non-cured state is formed, as shown in FIG. 14F.

As the condition under which the lamination is carried out while the non-cured states of the first and fourth sheet-like materials 50 and 60 are maintained, it is preferable that the foregoing laminate is heated at approximately 120° C. in the step described with reference to FIG. 14E, in the case where the atmosphere temperature when the wiring patterns 54 and 55 are transferred is, for instance, approximately 100° C. This is because even if the curing of the thermosetting resin contained in the first sheet-like material 50 is promoted by the transfer of the wiring patterns in an atmosphere at 100° C., such first and fourth sheet-like materials 50 and 60 can be laminated without delamination occurring thereto.

Next, the wiring pattern 62 transferred is subjected to Au plating by the additive method. In the method of forming metal layers on the transferred wiring pattern 62 as described above, a step of immersing the sheet-like materials (the first and fourth sheet-like materials 50 and 60) in a chemical solution is performed only after the plating step.

As described above, a plurality of the sheet-like materials having through holes that are to become an insulation member 65 when they are laminated (the first and fourth sheet-like materials 50 and 60) are formed using a material containing an inorganic filler and a resin composition containing a thermosetting resin in a non-cured state, and conductive materials 52b and 52a are filled in the through holes 51 and 59. The plurality of the sheet-like materials (the first and fourth sheet-like materials 50 and 60) are laminated so that the wiring layer 410 (the wiring pattern 54) is arranged between the different sheet-like materials (the first and fourth sheet-like materials 50 and 60). The electrode-part-connection electrodes 402 are provided on one surface 65a of the insulation member 65 on one side thereof, while the external electrodes 407 are provided on an opposite surface 65b of the same. Thus, a mounting member 66 having a multilayer wiring structure is prepared (see FIG. 14G).

Figure 15A:
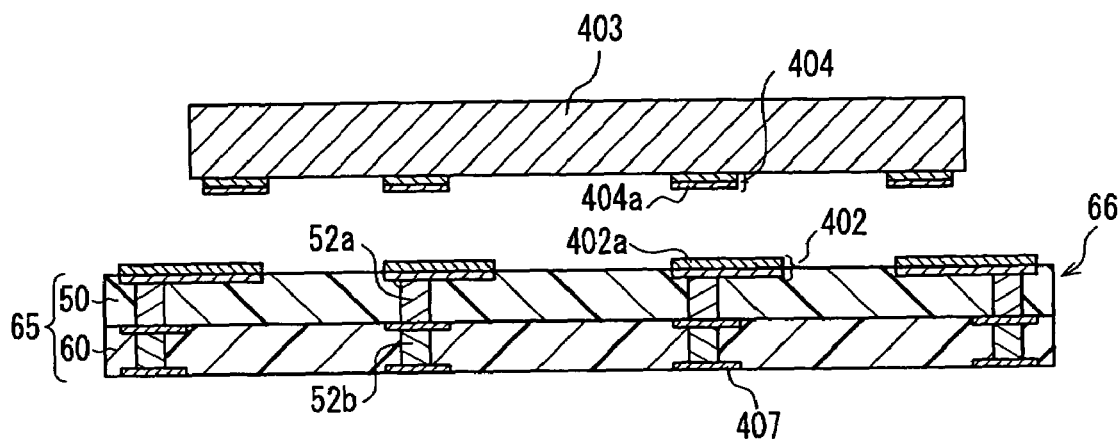

Then, as shown in FIG. 15A, the semiconductor element 403 and the mounting member 66 are superposed so that the electrode parts 404 and the electrode-part-connection electrodes 402 are brought into contact with each other, and while pressure is applied thereto in a thickness direction thereof, surfaces at which the metal layers (Au layers) 404a of the electrode parts 404 and the metal layers (Au layers) 402a of the electrode-part-connection electrodes 402 are in contact with each other are heated by ultrasonic vibration, so that the electrode parts 404 and the electrode-part-connection electrodes 402 are connected by metal joint.

Figure 15B:
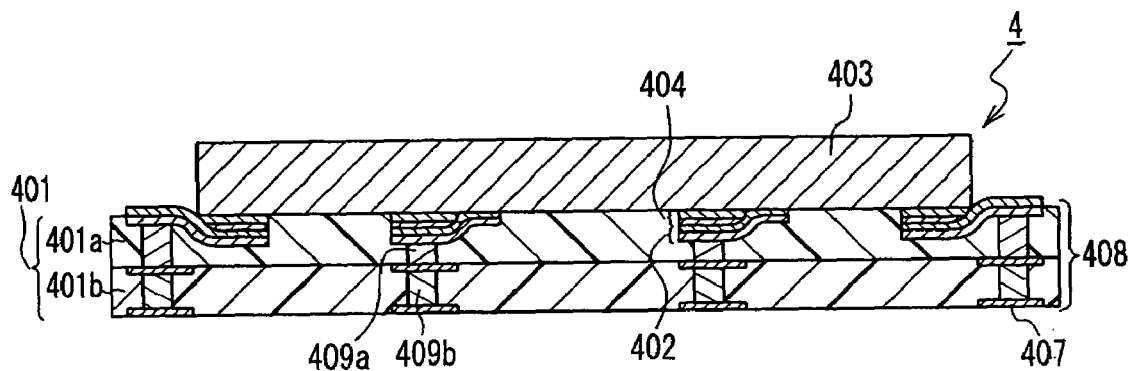

Next, the laminate composed of the mounting member 66 and the semiconductor element 403 is heated and subjected to pressure in its thickness direction so that the electrode-part-connection electrodes 402 and the electrode parts 404 are embedded in the insulation member 65, and the insulation member 65 and the conducive resin compositions 52b and 52a are cured so that the semiconductor element 403 and the mounting member 66 are bonded with each other. As shown in FIG. 15B, the cured insulation member 65 becomes the insulation layer 401 including the upper and lower insulation layers 401a and 401b, the conductive resin compositions 52a and 52b become inner vias 409a and 409b, and the mounting member 66 becomes the wiring substrate 408.

By the method of manufacturing a semiconductor device according to the present embodiment, which employs the wiring substrate 408 of the multilayer wiring structure and arranges the external electrodes 407 in the area array style, a downsized semiconductor device can be provided with a high degree of freedom in wiring layout.

It should be noted that in the step described with reference to FIG. 15A, after the semiconductor element 403 and the mounting member 66 are integrated, the semiconductor element 403 may be thinned to not less than 30 µm and not more than 100 µm in thickness by a processing method such as cutting or polishing. Particularly, the semiconductor element 403 can be thinned at a significantly high rate by cutting. Since the semiconductor element 403 is thinned after it is bonded with the mounting member 66 (cured thereby having become the wiring substrate 408), a difficult step can be avoided such as a step of handling the thinned semiconductor element 403 and bonding the thinned semiconductor element 403 with the wiring substrate 408.

Embodiment 10

The present embodiment relates to a method for manufacturing the semiconductor device shown in FIG. 6, which is described below with reference to FIGS. 16A to 16E.

Figure 16A:
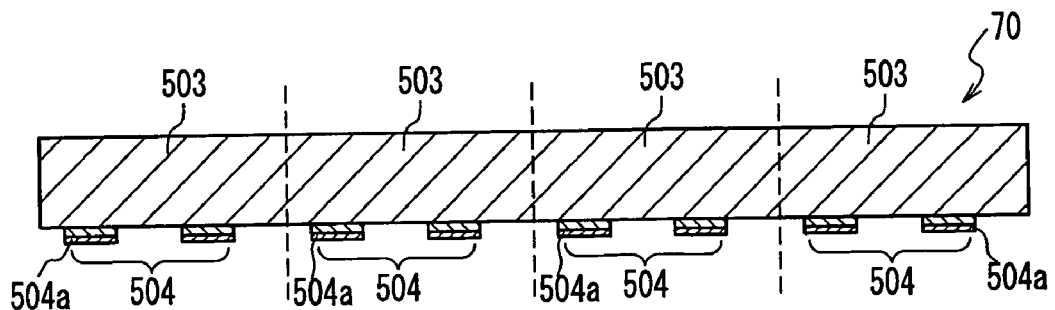
FIGS. 16A to 16E are views illustrating an example of a process for manufacturing the semiconductor device shown in FIG. 6.
Figure 16B:
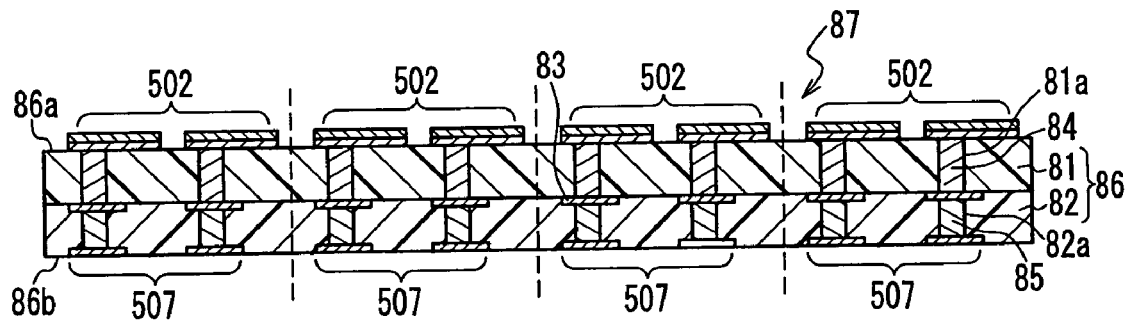

First of all, as shown in FIG. 16A, semiconductor element material 70 including a plurality of the semiconductor elements 503 having the electrode parts 504 is prepared. The semiconductor element material 70 in a plate form has a work size of, for instance, 100 mm$^2$ or 200 mm$^2$, and preferably is in a circular shape as required. The electrode parts 504 include metal layers (Au layers) 504a, but the metal layers may be solder alloy layers instead of the Au layers.

Next, sheet-like materials 81 and 82 having through holes 81a and 82a, respectively, are formed with a material containing an inorganic filler and a resin composition containing a thermosetting resin in a non-cured state. It should be noted that the sheet-like materials 81 and 82 are to become an insulation member 86 when they are laminated. Then, a conductive material, for instance, conductive resin compositions 84 and 85, is filled in the through holes 81a and 82a, respectively. Next, the sheet-like materials 81 and 82 are laminated so that a wiring layer 83 is interposed between the sheet-like materials 81 and 82, and a plurality of sets of the electrode-part-connection electrodes 502 are provided on a surface 86a of the insulation member 86 on one side thereof, while a plurality of sets of the external electrodes 507 are provided on a surface 86b of the same opposite thereto. Thus, a mounting member 87 having a multilayer wiring structure is formed. The mounting member 87 is formed with the same material through the same process as those for the wiring substrate of Embodiment 4 described above (see FIG. 16B).

Figure 16C:
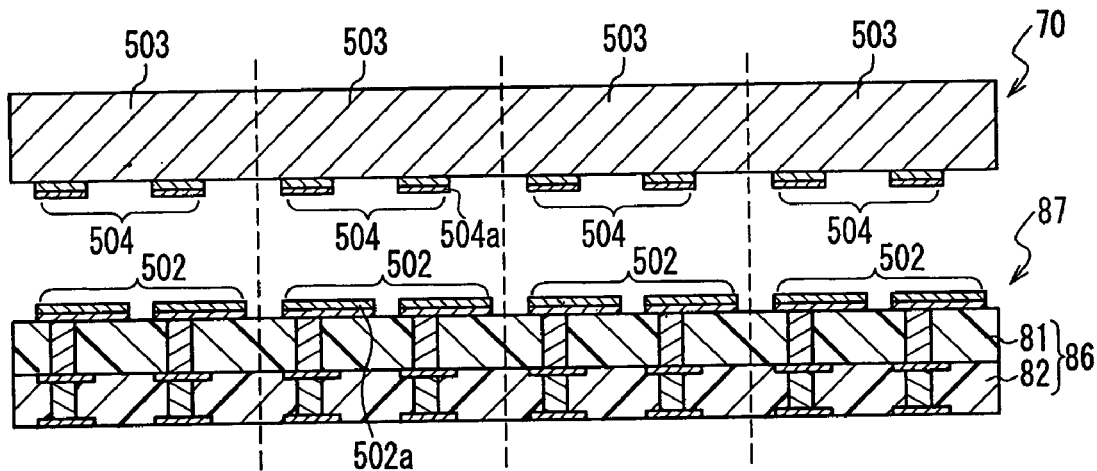

Next, as shown in FIG. 16C, the mounting member 87 and the semiconductor element material 70 are superposed face down so that the electrode parts 504 and the electrode-part-connection electrodes 502 are brought into contact with each other. Before the mounting member 87 and the semiconductor element material 70 are superposed, a surface of the semiconductor element material 70 that is to face the mounting member 87 preferably is subjected to a coupling treatment, and thereafter is coated with an insulation resin. This is because the adhesion between the mounting member 87 and the semiconductor element material 70 is enhanced. The coupling treatment is carried out, for instance, in the same method as that of Embodiment 2 described above, and as to the insulation resin also, the same material as that of Embodiment 2 is used.

Next, while the laminate composed of the mounting member 87 and the semiconductor element material 70 is subjected to pressure in the thickness direction, surfaces at which the metal layers (Au layers) 504a of the electrode parts 504 and the metal layers (Au layers) 502a of the electrode-part-connection electrodes 502 are in contact with each other are heated by ultrasonic vibration, so as to be connected by metal joint.

Figure 16D:
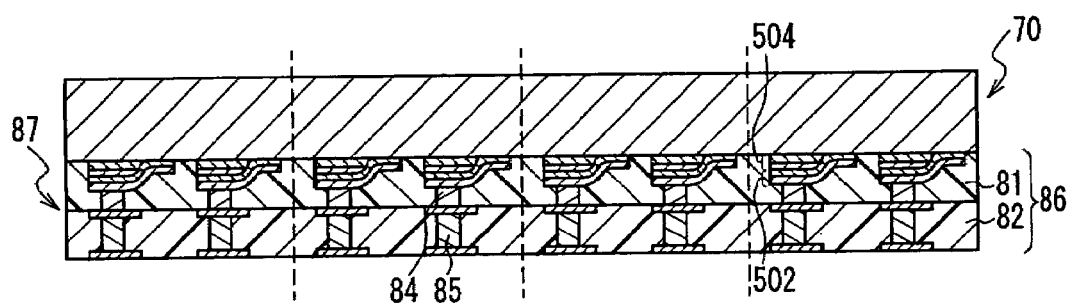

Then, as shown in FIG. 16D, the laminate composed of the mounting member 87 and the semiconductor element material 70 is heated and subjected to pressure in its thickness direction so that the electrode-part-connection electrodes 502 and the electrode parts 504 are embedded in the insulation member 86, and the sheet-like materials 81 and 82 and the conducive resin compositions 84 and 85 are cured so that the mounting member 87 and the semiconductor element material 70 are bonded with each other.

Figure 16E:
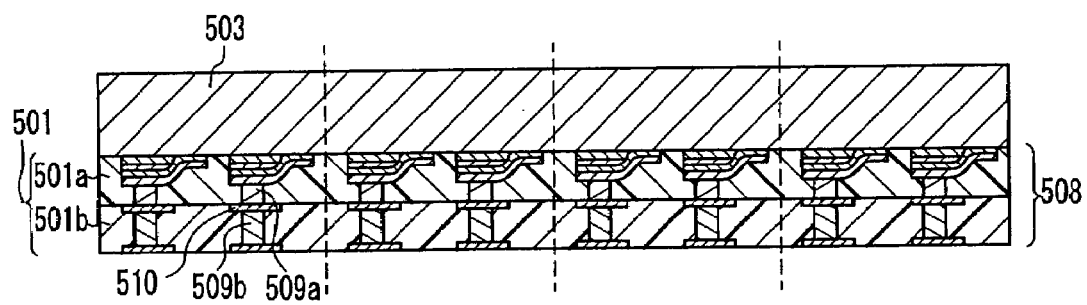

Next, the semiconductor element material 70 and the mounting member 87 are cut together at predetermined positions (positions indicated by dotted lines in FIGS. 16A to 16E), so that the individual semiconductor elements are separated from one another. As shown in FIG. 16E, the sheet-like materials 81 and 82 thus divided become the insulation layer 501 including the upper and lower insulation layers 501a and 501b, while the conductive resin compositions 84 and 85 become inner vias 509a and 509b, respectively. Further, the wiring layer 83 thus divided becomes the wiring layer 510, while the mounting member 87 thus divided becomes the wiring substrate 508.

Thus, by the manufacturing method of the present embodiment, the size of the surface of the wiring substrate on the semiconductor element side and the size of the surface of the semiconductor element on the wiring substrate can be made equal to each other, whereby a downsized semiconductor device can be manufactured with excellent productivity.

It should be noted that the semiconductor element 503 may be processed to have a thickness of not less than 30 µm and not more than 100 µm as required, but this thickness processing with respect to the semiconductor element 503 preferably is performed before the step of cutting the semiconductor element material 70 and the mounting member 87 together at predetermined positions (positions indicated by dotted lines in FIGS. 16A to 16E). This is because this provides excellent productivity and facilitates a stress relief step.

Embodiment 11

The present embodiment relates to a circuit component built-in module incorporating the semiconductor device 4 shown in FIG. 5A and another circuit component, and a method for manufacturing the same, which are described with reference to FIGS. 17A to 17D.

Figure 17A:
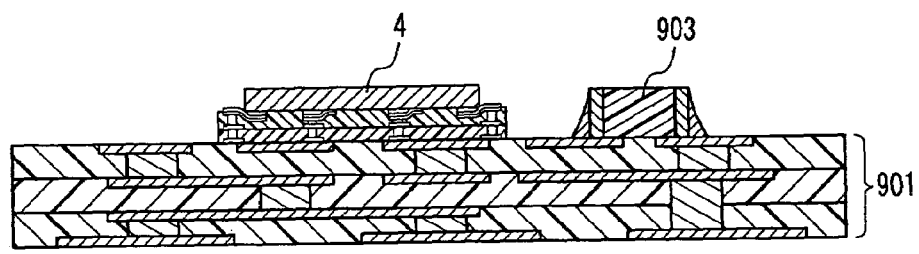
FIGS. 17A to 17D are views illustrating a process for manufacturing a circuit component built-in module incorporating the semiconductor device shown in FIG. 5A and another circuit component.
Figure 17B:
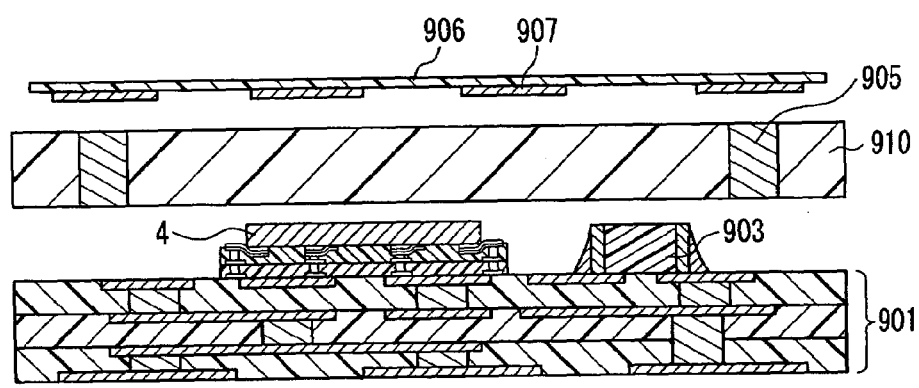
Figure 17C:
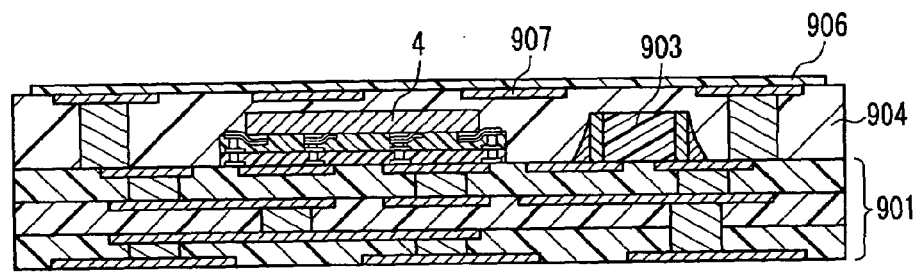
Figure 17D:
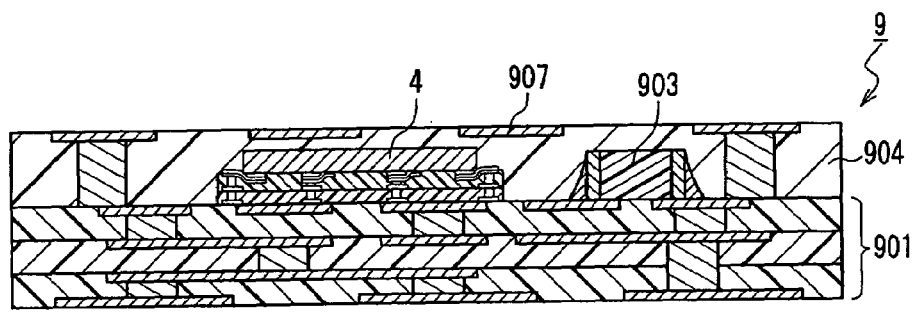

A circuit component built-in module 9 according to the present embodiment includes: a wiring substrate 901 for a module (hereinafter referred to as module wiring substrate 901); an insulation substrate 904 arranged on the module wiring substrate 901; and the semiconductor device 4 mounted on the module wiring substrate 901 and embedded in the insulation substrate 904, as shown in FIG. 17D. The semiconductor device 4 includes, as shown in FIG. 5A: a semiconductor element 403 having electrode parts 404; and a wiring substrate 408 including an insulation layer 401, electrode-part-connection electrodes 402 provided in the insulation layer 401, and external electrodes 407 provided on the insulation layer 401 and connected electrically with the electrode-part-connection electrodes 402, in which the electrode parts 404 and the electrode-part-connection electrodes 402 are connected electrically. The insulation layer has an elastic modulus of not less than 0.1 GPa and not more than 5 GPa, and the electrode parts and the electrode-part-connection electrodes are connected by metal joint.

In manufacturing the circuit component built-in module 9 of the present embodiment, first, a multilayer wiring substrate (substrate for a module) 901, the semiconductor device 4 of the present invention, and another circuit component 903, for instance, a chip component, are prepared as shown in FIG. 17A, and the semiconductor device 4 and the another circuit component 903 are mounted on the multilayer wiring substrate 901. As the mounting method, any method may be used such as the reflow mounting method employing solder, the mounting method employing a conductive adhesive, or the like. The multilayer wiring substrate 901 is not limited particularly. In the present embodiment, the multilayer wiring substrate 901 made of the same material as that of the wiring substrate of Embodiment 1 described above is used. The multilayer wiring substrate 901 has a thickness of approximately 0.05 mm to 0.3 mm, and the semiconductor device 4 and the circuit component 903 have a thickness of not more than 0.3 mm each. It should be noted that in FIGS. 17A to 17D, the multilayer wiring substrate 901 is illustrated as if it would have a thickness greater than the thickness of the semiconductor device 4 and the circuit component 903, for convenience.

Next, as shown in FIG. 17B, a sheet-like material 910 in a non-cured state having flexibility is prepared. The sheet-like material 910 is formed with, for instance, the same material as that of the insulation member 30 of Embodiment 1 described above.

Then, through holes are formed in the sheet-like material 910, and a conductive material, for instance, a conductive resin composition 905, is filled in the through holes. The through holes are formed through, for instance, the same process as that described with reference to FIG. 11C.

On the other hand, a transfer carrier 906 provided with a wiring pattern 907 is prepared.

Next, on the multilayer wiring substrate 901 on which the semiconductor element 4 of the present invention and the circuit component 903 are mounted, the sheet-like material 910 having the through holes filled with the conductive resin composition 905 and the transfer carrier 906 provided with the wiring pattern 907 are aligned and superposed in the stated order, and are subjected to temperature of 100° C. to 180° C. and pressure of 3 GPa to 10 GPa. By so doing, the semiconductor device 4 of the present invention, the circuit component 903, and the wiring pattern 907 are embedded in the sheet-like material 910, and then, the sheet-like material 910 is cured to become the insulation substrate 904 (see FIG. 17C).

Subsequently, the transfer carrier 906 only is removed from the insulation substrate 904 so as to expose the wiring pattern 907, whereby the circuit component built-in module 9 is obtained (see FIG. 17D).

In the circuit component built-in module 9 according to the present embodiment, both of the semiconductor device 4 and the circuit component 903 that are incorporated therein have a small thickness of not more than 0.3 mm each.

Therefore, the circuit component built-in layer (sheet-like material 910) can be formed thin so as to have a thickness of not more than 0.4 mm. Accordingly, the circuit component built-in module 9 can be made thin so as to have an overall thickness, including the thickness of the multilayer wiring substrate 901, of approximately 0.5 mm to 0.7 mm.

The following will describe the semiconductor device of the present invention more specifically, referring to the semiconductor device 1 of Embodiment 1 as an example.

First of all, mixtures of the following compositions were prepared for preparing the insulation member 30 (see FIG. 9B).

EXAMPLE 1

Epoxy resin (manufactured by Asahi-Chiba Co., Ltd., currently Asahi Kasei Epoxy Co., Ltd., 6041, Tg=75° C.): 22 wt %

$SiO_2$ (manufactured by Izumitec Co., Ltd., Product name: SCM-QZ, mean particle diameter: 7 μm): 77 wt %

Methyl ethyl ketone: 1 wt %

EXAMPLE 2

Epoxy resin (manufactured by Asahi-Chiba Co., Ltd., currently Asahi Kasei Epoxy Co., Ltd., 6041, Tg=75° C.): 13 wt %

$Al_2O_3$ (manufactured by Showa Denko K.K., Product name: AS-40, mean particle diameter: 12 μm): 86 wt %

Methyl ethyl ketone: 1 wt %

EXAMPLE 3

Epoxy resin (manufactured by Nippon Pelnox Corporation, WE-2025, Tg=50° C.): 6 wt %

Epoxy resin (manufactured by Asahi-Chiba Co., Ltd., currently Asahi Kasei Epoxy Co., Ltd., 6018, Tg=130° C.): 7 wt %

$SiO_2$ (manufactured by Izumitec Co., Ltd., Product name: SCM-QZ, mean particle diameter: 7 μm): 86 wt %

Methyl ethyl ketone: 1 wt %

EXAMPLE 4

Epoxy resin (manufactured by Yuka Shell Epoxy K.K., currently Japan Epoxy Resins Co., Ltd., EPIKURE YH-306, Tg=110° C.): 9 wt %

$SiO_2$ (manufactured by Izumitec Co., Ltd., Product name: SCM-QZ, mean particle diameter: 7 μm): 90 wt %

Methyl ethyl ketone: 1 wt %

EXAMPLE 5

Epoxy resin (manufactured by Yuka Shell Epoxy K.K., currently Japan Epoxy Resins Co., Ltd., EPIKURE YH-306, Tg=110° C.): 9 wt %

$Al_2O_3$ (manufactured by Showa Denko K.K., Product name: AS-40, mean particle diameter: 12 μm): 90 wt %

Methyl ethyl ketone: 1 wt %

EXAMPLE 6

Polyimide (manufactured by New Japan Chemical Co., Ltd., RIKACOAT EN-20, Tg=190° C.): 11 wt %

$SiO_2$ (manufactured by Izumitec Co., Ltd., Product name: SCM-QZ, mean particle diameter: 7 μm): 88 wt %

Methyl ethyl ketone: 1 wt %

EXAMPLE 7

Polyimide (manufactured by New Japan Chemical Co., Ltd., RIKACOAT EN-20, Tg=190° C.): 7 wt %
Epoxy resin (manufactured by Asahi-Chiba Co., Ltd., currently Asahi Kasei Epoxy Co., Ltd., 6041, Tg=75° C.): 7 wt %
$SiO_2$ (manufactured by Izumitec Co., Ltd., Product name: SCM-QZ, mean particle diameter: 7 μm): 85 wt %
Methyl ethyl ketone: 1 wt %

EXAMPLE 8

Epoxy resin (Tg=150° C.): 13 wt %
$SiO_2$ (manufactured by Izumitec Co., Ltd., Product name: SCM-QZ, mean particle diameter: 7 μm): 86 wt %
Methyl ethyl ketone: 1 wt %

Comparative Example 1

Epoxy resin (manufactured by Asahi-Chiba Co., Ltd., currently Asahi Kasei Epoxy Co., Ltd., 6099, Tg=178° C.): 22 wt %
$SiO_2$ (manufactured by Izumitec Co., Ltd., Product name: SCM-QZ, mean particle diameter: 7 μm): 77 wt %
Methyl ethyl ketone: 1 wt %

Comparative Example 2

Epoxy resin (manufactured by Asahi-Chiba Co., Ltd., currently Asahi Kasei Epoxy Co., Ltd., 6099, Tg=178° C.): 13 wt %
$SiO_2$ (manufactured by Izumitec Co., Ltd., Product name: SCM-QZ, mean particle diameter: 7 μtm): 86 wt %
Methyl ethyl ketone: 1 wt %

Comparative Example 3

Epoxy resin (manufactured by Asahi-Chiba Co., Ltd., currently Asahi Kasei Epoxy Co., Ltd., 6099, Tg=178° C.): 9 wt %
$Al_2O_3$ (manufactured by Showa Denko K.K., Product name: AS-40, mean particle diameter: 12 μm): 90 wt %
Methyl ethyl ketone: 1 wt %

Comparative Example 4

Thermosetting polyphenylene ether resin (Tg=198° C.): 22 wt %
$SiO_2$ (manufactured by Izumitec Co., Ltd., Product name: SCM-QZ, mean particle diameter: 7 μm): 77 wt %
Methyl ethyl ketone: 1 wt %

Note: The glass transition temperatures (Tg) were determined by the dynamic mechanical analysis (DMA) method.

Each of mixtures of compositions of Examples 1 to 8 and Comparative Examples 1 to 4 was mixed by rotation at a rate of 120 rpm in a pot for 24 hours, and a slurry as a material for an insulation member 30 (see FIG. 9B) was prepared. Thereafter, the slurry was formed in a film form by doctor blading, methyl ethyl ketone was removed by drying, and the film was cut into a predetermined size, whereby the insulation member 30 with a thickness of 100 μm having flexibility in a non-cured state was obtained (see FIG. 9B).

Next, as shown in FIG. 9C, on a surface 30a of the insulation member 30 on one side thereof, a copper film with a thickness of 9 μm was laminated, and a wiring pattern 31b was formed by the subtractive method. Thereafter, the insulation member 30 was washed with water and dried. Next, the insulation member was subjected electroless plating, so that a wiring pattern 31 in a protruded form having Au layers on its surface was formed. Thereafter, the insulation member 30 provided with the wiring pattern 31 was washed with water and dried, whereby a mounting member 32 (see FIG. 9C) was obtained.

Next, as shown in FIG. 9D, the mounting member 32, and a semiconductor element including electrode parts 104 whose surfaces were plated with Au (i.e., having Au layers) (TEG, 10 mm square, 0.1 mm thick, having 100 pad electrodes (electrode parts), distance between pad electrodes: 125 μm) were aligned and superposed. Next, the laminate of these was heated at 40° C., and while pressure of 1.5 N per electrode part (pad electrode) was applied thereto, surfaces at which the electrode parts 104 and the wiring pattern 31 were brought into contact with each other were heated using ultrasonic vibration, so that the electrode parts 104 and the electrode-part-connection electrodes 102 were connected by metal joint. The frequency of the ultrasonic was 60 kHz, and the time of oscillating the ultrasonic wave was 500 m/s.

Next, the laminate composed of a semiconductor element 103 and the mounting member 32 was heated at 120° C. while pressure of 3 MPa was applied thereto so that portions of the wiring pattern 31 that were bonded with the electrode parts 104 (electrode-part-connection electrodes 102) and the electrode parts 104 were embedded in the insulation member 30. Thus, the semiconductor element 103 and the mounting member 32 were brought into close contact with each other, and the insulation member 30 was cured. The semiconductor device thus obtained had a thickness of 200 μm (see FIG. 9E).

An elastic modulus and a thermal expansion coefficient of the insulation layer were measured as to each of the semiconductor devices of Examples 1 to 8 and Comparative Examples 1 to 4. The elastic modulus was measured by the method described below, and the coefficient of thermal expansion was measured by the thermomechanical analysis (TMA) method. Thermal shock tests were performed by the following method. The results of these tests are shown in Table 1.

[Elastic Modulus]

Figure 18:
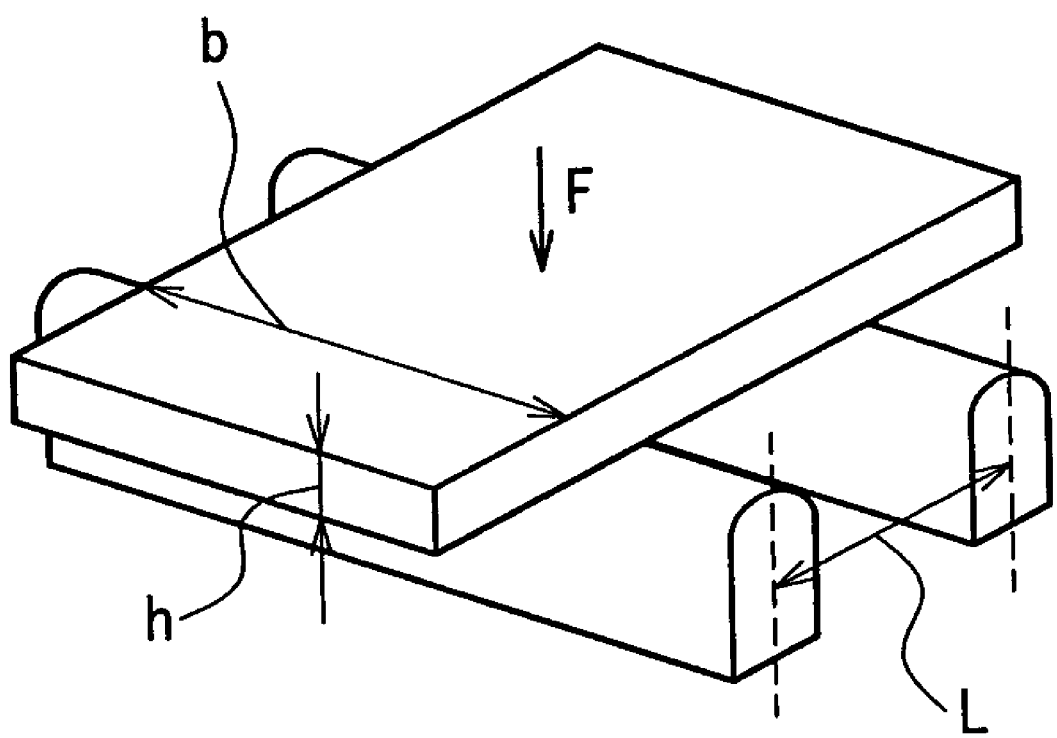
FIG. 18 is a perspective view illustrating a device for measuring an elastic modulus.
Figure 19:
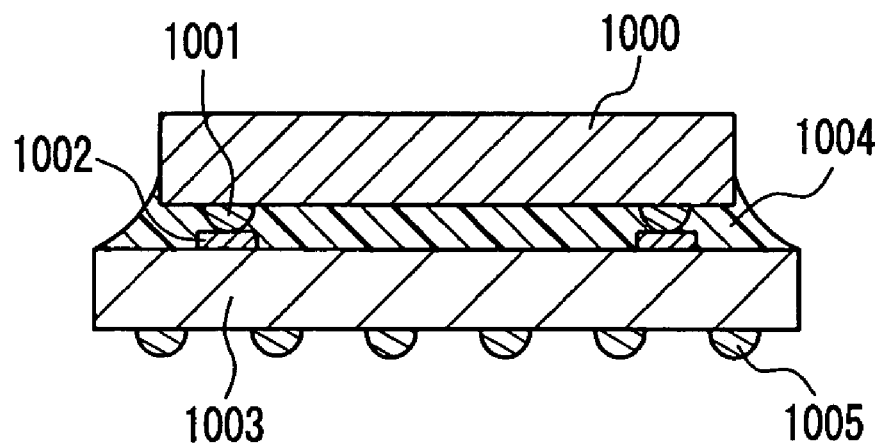
FIG. 19 is a cross-sectional view illustrating a conventional semiconductor device.
Figure 20:
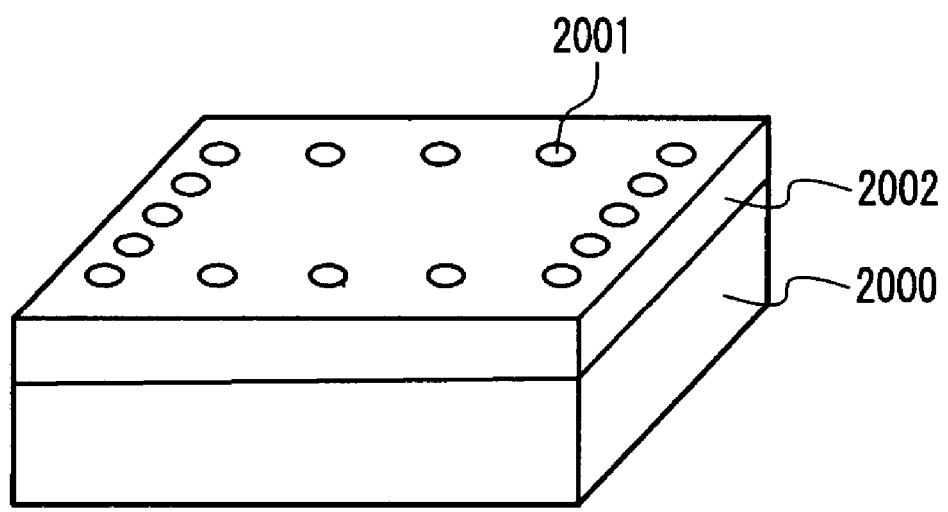
FIG. 20 is a perspective view illustrating a conventional semiconductor device.

The elastic modulus was measured according to JIS K6911. A sample that was 1.5 mm thick, 8 mm±1 mm wide, and 50 mm long was prepared, both ends of the sample were supported by supports as shown in FIG. 18, and a load F (2 kgf to 5 kgf) was applied to a center area of the sample from above. A distance L between the supports was 24 mm, and a lading rate was 0.8 mm/min. An inclination (F/Y) in a straight line region of the obtained load-deflection curve was calculated, and it was substituted in a Formula 1 shown below, so as to calculate the elastic modulus.

$$E=(L^3/4bh^3)\times(F/Y) \qquad \text{(Formula 1)}$$

b: width of sample (mm)
h: thickness of sample (mm)
L: distance between supports (mm)
F: load (kgf)
F/Y: inclination of load-deflection curve

[Thermal Shock Test]

An operation of leaving a circuit component package in an atmosphere at −55° C. for 30 minutes, and subsequently leaving the same in an atmosphere at 125° C. for 30 minutes as one cycle was repeated 1000 times, and if a connection resistance was not more than 100 mΩ per electrode part, this was regarded as indicating that excellent electric connection was achieved. This is indicated with ○ in Table 1. In the case where the connection resistance was completely unchanged from that at an initial stage, this is indicated with ⊙. In the case where the connection resistance exceeded 100 mΩ per electrode part before the 1000 cycles of the foregoing operation were completed, this is indicated with X.

TABLE 1

|  | Inorganic filler (wt %) | Resin composition (wt %) | Tg (° C.) | Elastic modulus (GPa) | Thermal expansion coefficient (ppm/° C.) | Thermal shock test result |
|---|---|---|---|---|---|---|
| Ex. 1 | 77 (78) | 22 (22) | 75 | 3 | 12 | ○ |
| Ex. 2 | 86 (87) | 13 (13) | 75 | 4 | 19 | ○ |
| Ex. 3 | 86 (87) | 13 (13) | 50/130 | 3 | 9 | ⊙ |
| Ex. 4 | 90 (91) | 9 (9) | 110 | 4 | 7 | ⊙ |
| Ex. 5 | 90 (91) | 9 (9) | 110 | 4 | 13 | ○ |
| Ex. 6 | 88 (89) | 11 (11) | 190 | 3 | 10 | ⊙ |
| Ex. 7 | 85 (86) | 14 (14) | 190/75 | 4 | 11 | ⊙ |
| Ex. 8 | 86 (87) | 13 (13) | 150 | 5 | 13 | ○ |
| Comp. Ex. 1 | 77 (78) | 22 (22) | 178 | 20 | 13 | X |
| Comp. Ex. 2 | 86 (87) | 13 (13) | 178 | 20 | 9 | X |
| Comp. Ex. 3 | 90 (91) | 9 (9) | 178 | 36.5 | — | X |
| Comp. Ex. 4 | 77 (78) | 22 (22) | 198 | 12 | — | X |

Note:
Values in brackets in the "Inorganic filler" column and the "Resin composition" column in Table 1 were calculated in terms of composition not containing solvent.

It is seen from Table 1 that in the case where the elastic modulus of the insulation layer was not less than 1 GPa and not more than 5 GPa, a change in the connection resistance was small, and high connection reliability in electrical connection was achieved. Besides, in the case where the material containing a thermosetting resin did not contain thermosetting polyimide, the material had an elastic modulus of not more than 5 GPa in the case where it contained a thermosetting resin with a glass transition temperature of not higher than 150° C., and the material had an elastic modulus of more than 5 GPa in the case where all the thermosetting resins contained in the insulation layer had glass transition temperatures of higher than 150° C. Still further, in the case where the material containing a thermosetting resin did not contain thermosetting polyimide and contained two or more thermosetting resins, the material had an elastic modulus of not less than 1 GPa and not more than 5 GPa as long as it contained at least one kind of a thermosetting resin with a glass transition temperature of not higher than 150° C.

Still further, it was confirmed that in the case where the value of the thermal expansion coefficient of the insulation layer was approximated to the value of the thermal expansion coefficient of the semiconductor element (3 ppm/° C.) by appropriately adjusting the type, amount, and particle diameter of the inorganic filler, the connection reliability was improved further.

As has been described so far, with the configuration of the semiconductor device of the present invention and the method of the present invention for manufacturing a semiconductor device, a thin, low-cost, and highly reliable semiconductor device can be provided.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    a semiconductor element including a plurality of electrode parts; and
    a wiring substrate including:
        an insulation layer;
        an electrode-part-connection electrode provided in the insulation layer; and
        an external electrode that is provided in the insulation layer and that is connected electrically with the electrode-part-connection electrode,
        the electrode part and the electrode-part-connection electrode being connected electrically with each other; wherein
    the insulation layer has an elastic modulus of not less than 0.1 GPa and not more than 5 GPa, and
    a surface of the electrode-part-connection electrode defining a smooth surface with adjacent portions of a surface of the wiring substrate on a semiconductor element side, and the surface of the wiring substrate on the semiconductor element side being recessed at a position where the electrode-part-connection electrode is provided;
    the electrode part and the electrode-part-connection electrode include metal layers made of at least one kind of metal selected from the group consisting of noble metals and solder alloys, and
    the metal layer of the electrode part and the metal layer of the electrode-part-connection electrode are connected by a metal joint that is devoid of bumps, and
    further wherein
    a surface of the wiring substrate on a semiconductor element side and a surface of the semiconductor element on a wiring substrate side are bonded directly with each other so that spaces between the electrode parts are filled with the insulation layer.

2. The semiconductor device according to claim 1, wherein a surface of the wiring substrate on the semiconductor element side extends beyond edges of the surface of the semiconductor element on the wiring substrate side.

3. The semiconductor device according to claim 2, wherein the external electrode is arranged on a surface of the insulation layer that is seen when the semiconductor device is observed in the thickness direction thereof from a semiconductor element side.

4. The semiconductor device according to claim 1, wherein
    the wiring substrate further includes an inner via that is provided in the insulation layer so as to go through the insulation layer in a thickness direction thereof, and
    the electrode-part-connection electrode and the external electrode are connected electrically through the inner via.

5. The semiconductor device according to claim 4, wherein the wiring substrate further includes at least one wiring layer arranged in the insulation layer.

6. The semiconductor device according to claim 1, wherein the insulation layer is made of a material containing a thermosetting resin.

7. The semiconductor device according to claim 6, wherein the material containing a thermosetting resin contains 75 wt % to 91 wt % of an inorganic filler, and 9 wt % to 25 wt % of a resin composition containing a thermosetting resin.

8. The semiconductor device according to claim 7, wherein the thermosetting resin contains at least one kind of resin selected from the group consisting of epoxy resins, phenol resins, cyanate resins, and thermosetting polyimide.

9. The semiconductor device according to claim 8, wherein in the case where the material containing the thermosetting resin does not contain thermosetting polyimide, the material containing the thermosetting resin contains a thermosetting resin with a glass transition temperature of not higher than 150° C.

10. The semiconductor device according to claim 1, wherein the semiconductor element has a thickness of not less tan 30 μm and not more than 100 μm.

11. The semiconductor device according to claim 1, wherein the insulation layer has a thickness of not less than 30 μm and not more than 200 μm.

12. The semiconductor device according to claim 1, wherein the semiconductor device has a thickness of not less than 60 μm and not more than 300 μm.

* * * * *

UNITED STATES PATENT AND TRADEMARK OFFICE
CERTIFICATE OF CORRECTION

| | | |
|---|---|---|
| PATENT NO. | : 7,132,756 B2 | Page 1 of 1 |
| APPLICATION NO. | : 10/692938 | |
| DATED | : November 7, 2006 | |
| INVENTOR(S) | : Sugaya et al. | |

It is certified that error appears in the above-identified patent and that said Letters Patent is hereby corrected as shown below:

First page, second column, third line of FOREIGN PATENT DOCUMENTS:
" 9-1881119 " should read -- 9-181119 --.
First page, second page, line 12 of the ABSTRACT: "GP a" should read --GPa--.
Column 36, line 3(claim10): "tan" should read --than--

Signed and Sealed this

Twenty-sixth Day of June, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,132,756 B2 | Page 1 of 1 |
| APPLICATION NO. | : 10/692938 | |
| DATED | : November 7, 2006 | |
| INVENTOR(S) | : Sugaya et al. | |

It is certified that error appears in the above-identified patent and that said Letters Patent is hereby corrected as shown below:

First page, second column, third line of Item (56) FOREIGN PATENT DOCUMENTS: " 9-1881119 " should read -- 9-181119 --.
First page, second column, line 12 of Item (57) the ABSTRACT: "GP a" should read --GPa--.
Column 36, line 3(claim10): "tan" should read --than--

Signed and Sealed this

Sixteenth Day of October, 2007

JON W. DUDAS
*Director of the United States Patent and Trademark Office*